US007482273B1

(12) United States Patent
Klein et al.

(10) Patent No.: US 7,482,273 B1
(45) Date of Patent: Jan. 27, 2009

(54) TRANSMISSIVE DYNAMIC PLASMA STEERING METHOD FOR RADIANT ELECTROMAGNETIC ENERGY

(75) Inventors: Timothy R. Klein, Dayton, OH (US); Stanley Rogers, Dayton, OH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 331 days.

(21) Appl. No.: 11/518,742

(22) Filed: Sep. 11, 2006

(51) Int. Cl.
*H01L 21/44* (2006.01)

(52) U.S. Cl. ....................... 438/676; 438/474; 438/487; 343/908; 343/909; 343/905

(58) Field of Classification Search ................. 438/474, 438/487, 676, 795; 343/779, 853, 905, 908, 343/909; 315/111.21
See application file for complete search history.

(56) References Cited

U.S. PATENT DOCUMENTS

| | | | | |
|---|---|---|---|---|
| 4,160,903 | A * | 7/1979 | McKechnie et al. | 455/344 |
| 4,905,014 | A | 2/1990 | Gonzalez et al. | |
| 5,182,496 | A | 1/1993 | Manheimer et al. | |
| 5,864,322 | A | 1/1999 | Pollon et al. | |
| 6,825,814 | B2 | 11/2004 | Hayes | |
| 6,842,146 | B2 | 1/2005 | Alexeff et al. | |
| 6,856,301 | B2 | 2/2005 | Walker et al. | |
| 6,864,631 | B1 | 3/2005 | Wedding | |
| 6,917,351 | B1 | 7/2005 | Velayudhan et al. | |
| 6,919,685 | B1 | 7/2005 | Henderson et al. | |

OTHER PUBLICATIONS

Vidmar, R.J., "On the Use of Atmospheric Pressure Plasmas as Electromagnetic Reflectors and Absorbers", IEEE Transactions on Plasma Science, Aug. 1990, vol. 18. No. 4.

* cited by examiner

*Primary Examiner*—Haissa Philogene
(74) *Attorney, Agent, or Firm*—AFMCLO/JAZ; Gerald B. Hollins

(57) ABSTRACT

Radiant electromagnetic energy beam steering method achieved following antenna conversion from electrical current and voltage characterized signals to radiant wave characterized signals by way of the influence of gaseous plasma of controlled plasma density and electron density on the electromagnetic energy. Reflection and refraction mechanisms are used to impose plasma influence on the steered electromagnetic energy. The employed plasma properties are determined by an electrically energized array of electrodes disposed along the plasma extent. Adaptation of the method to widely differing wavelength parts of the electromagnetic energy spectrum is included. A plurality of prior art patents is identified in supplement of present disclosure of the invention.

15 Claims, 15 Drawing Sheets

(rotated Fig 3A)

800
802
804
806
808

801
808
814
816
812
808
820
824
826
828
830
832
818
822
844
842
810
840
10 electrodes pairs per λ
812
814
823
1-5mm 816
808
821
812
824
820
814
818
821

TRANSMISSIVE DYNAMIC PLASMA STEERING METHOD FOR RADIANT ELECTROMAGNETIC ENERGY

RIGHTS OF THE GOVERNMENT

The invention described herein may be manufactured and used by or for the Government of the United States for all governmental purposes without the payment of any royalty.

CROSS REFERENCE TO RELATED PATENT DOCUMENTS

The present document is somewhat related to the co-pending and commonly assigned patent application documents "DYNAMIC PLASMA STEERING METHOD FOR RADIANT ELECTROMAGNETIC ENERGY", Ser. No. 11,518,750; "TRANSMISSIVE DYNAMIC PLASMA STEERING APPARATUS FOR RADIANT ELECTROMAGNETIC ENERGY", Ser. No. 11/518,741; and "REFLECTIVE DYNAMIC PLASMA STEERING APPARATUS FOR RADIANT ELECTROMAGNETIC ENERGY", Ser. No. 11/518,749; which are each filed of even date herewith. The contents of these related even filing date applications are hereby incorporated by reference herein.

BACKGROUND OF THE INVENTION

The ability to steer or to controllably direct the path or the trajectory of a beam of radiant electromagnetic energy is a significantly useful tool in numerous radiant electromagnetic energy-based modern systems. Indeed, such ability to steer the travel direction of energy beams can be argued to be as significant in their utility as the underlying ability to place energy in these forms. Reflection of radiant energy in one or more manners has been known since the earth began and was perhaps first humanly experienced when a primitive man found light and heat from the sun was redirected by the smooth surface of a water body or from some naturally occurring objects such as a polished rock. In more modern times, the reflection of radio frequency spectrum energy from a metallic surface such as a reflector or from the surface of some object such as an aircraft or from moisture in a rain cloud has become the basis for radar systems of large variety. The use of metals as an energy reflection element across large portions of the electromagnetic spectrum has become a common event in environments as diverse as the electrical heater and the parabolic reflector used for electrical and optical signal enhancements.

The wide spectral extent of these radiant energy reflection characteristics are particularly notable and are relevant to the present invention. In terms of wavelength, radiant energy reflections are found to be especially useful in wavelengths extending from multiple centimeters as occur in the microwave portion of the radio frequency spectrum through the wavelengths measuring in microns as exist in the optical spectrum. Although the apparatus used to accomplish useful reflections in these diverse parts of the electromagnetic spectrum may differ significantly in physical arrangement it is possible to consider common principles applicable throughout this range of wavelengths and to speak of the generic concepts included in devices intended for more limited portions of this wavelength range in describing phenomenon occurring in the present invention. The optical end of this spectral range and energy steering accommodations made there may be considered first in approaching this broad spectral range.

Current liquid crystal and Microelectromechanical Deformable Micromirror (MEMS-DM) technologies do not for example offer the required ninety to one hundred twenty degree steering angles needed for effective optical and infrared beam steering purposes. Infrared radiation is however currently used for example in high fidelity sensing and is needed to deliver high energy to target objects at wide angles. Furthermore, present day agile beam-steering technologies for these wavebands or smaller can not operate in the high power/high energy environments needed for many projected military and non military uses expected in this spectral region with for example an infrared laser. Moreover inertia-free or electronically steered arrays, with characteristics needed for these uses in both the radio frequency and infrared applications have not heretofore been developed.

The use of energized or ionized gaseous plasma for video image display purposes has now become familiar in the electronic art. Devices of this type find utility in for example applications such as illuminated computer and television displays, large ballpark and stadium displays and aircraft instrumentation. Several of the prior art patents identified in the present document in fact use emissions from such gaseous plasma to stimulate phosphor transducer materials into emission of selected output wavelengths to provide a multicolor capable display. Interestingly, some of these herein identified patents also note a degree of similarity between plasma displays and the liquid crystal display that is frequently employed in lower energy applications such as battery powered watches and handheld electronic calculators for example. For present purposes, however, it appears significant to consider that such usage of ionized gas plasma in display oriented applications has heretofore largely ignored the capability of similarly disposed plasma to perform radiant energy steering functions.

Thus such plasma, when present in sufficient density, is found to have the ability to refract, radiate, absorb, transmit, and reflect electromagnetic wave energy over a wide range of radiant energy wavelengths and is seen as a possible answer to presently incurred radiant energy steering limitations. Infrared radiation in the electromagnetic wavelength spectrum from for example 0.4 micrometer to 12.5 micrometers is considered in the present invention. Along with this spectral range the arrangements of the invention are believed also usable in the radio frequency spectrum, in the microwave region for example.

SUMMARY OF THE INVENTION

The present invention thus provides for inertia free plasma based steering of radiant electromagnetic energy.

It is therefore an object of the present invention to provide plasma based steering of electromagnetic energy residing in portions of the electromagnetic spectrum inclusive of higher frequency radio waves and infrared waves.

It is thus an object of the present invention to provide methods suitable for these energy steering purposes.

It is another object of the invention to provide plasma based energy steering that is useful over wide spectral ranges notwithstanding a variety of relationships existing between the plasma frequency and the frequency of the steered electromagnetic wave.

It is another object of the invention to provide for dynamic plasma refractive steering of radiant radio frequency energy.

It is another object of the invention to provide for transmissive or refractive dynamic plasma steering of radiant radio frequency energy.

It is another object of the invention to provide for the dynamic plasma steering of an electromagnetic beam through processes providing beam deflection during single passage through a plasma steering media.

It is another object of the invention to provide for dynamic plasma transmissive steering of radiant optical wavelength energy such as infrared energy.

These and other objects of the invention will become apparent as the description of the representative embodiments proceeds.

These and other objects of the invention are achieved by the plasma based dynamic method of pass through steering radiant electromagnetic energy, said method comprising the steps of:

disposing an array of selectively sized ionizable plasma gas concentration enhancing shapes in registration with electrode pairs of an array of electrode pairs received in a surface of an energy steering architecture;

modulating electron density in ionized portions of said ionizable plasma gas of said plasma gas concentration enhancing shapes via electrical signals applied to selected of said energy steering architecture registered electrode pairs;

said modulating including dynamically changing voltages and waveforms applied to said selected electrode pairs and alteration of incident electromagnetic energy plasma pass through by ionized plasma electron density changes achieved through modulation energizing of said electrode pairs in said array of electrode pairs.

BRIEF DESCRIPTION OF THE DRAWINGS

The accompanying drawings incorporated in and forming a part of the specification, illustrate several aspects of the present invention and together with the description serve to explain the principles of the invention. In the drawings.

DETAILED DESCRIPTION

One way in which the present invention may be appreciated is to consider that in many transmitting antenna arrangements it is common practice to energize plural elements of the antenna with electrical signals that are phase adjusted with respect to each other in order to steer the output beam of the antenna into a particular direction with respect to the antenna axis. Such steering may be accomplished in a fixed manner or may be provided with changeable adjustments in order to dynamically redirect the antenna's output, even in real time. For present purposes it is significant to note that in such steering arrangements it is common practice to perform the needed signal phase adjustments by electrical means, that is, through use of components located in the electrical signal paths leading to the antenna elements. In accordance with the present invention however such signal phase adjustment by electrical means and its accomplishment prior to arrival at the system antenna may be replaced with signal phase adjustments achieved following the system antenna, i.e., by phase adjustments to the radiant electromagnetic energy emitted from the antenna elements. Moreover in the present invention these phase adjustments may be accomplished in an inertia free high speed manner by the manipulation of signal phase shifting elements comprising nothing more than ionized gases. Before herein dealing with these prospects directly it appears appropriate to consider certain related background concepts as follow.

Figure 1:
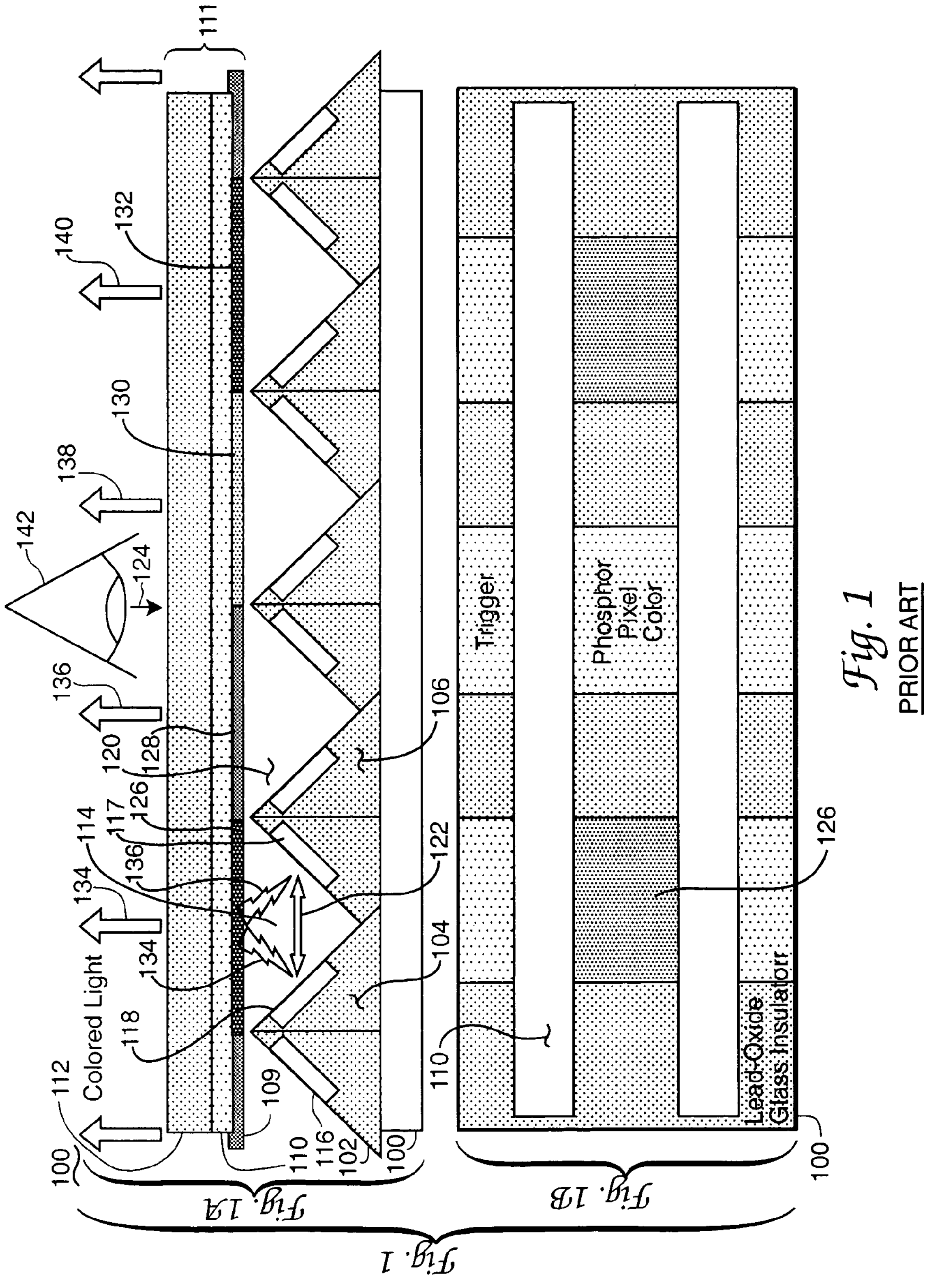
Fig. 1 PRIOR ART
FIG. 1 includes the views of FIG. 1A and FIG. 1B and shows two views of an existing plasma based display apparatus.

FIG. 1 in the drawings herein thus shows in FIG. 1A and FIG. 1B a cross sectional view and a top view of a plasma display apparatus as is frequently employed in present day television receivers and computer displays for example. In the FIG. 1 plasma apparatus a substrate 100 of material such as lead-oxide glass is covered by an array of triangular cross sectioned protuberances 104, 106 and so-on, protuberances that are also frequently fabricated of lead oxide glass. Each of the triangular cross section protuberances of the 104, 106 type carries a pair of electrically conductive electrodes, made of for example metallic gold, as are shown typically at 116, 117 and 118. These electrodes are individually fed from external driver electrical circuits.

Overlying the array of triangular cross section protuberances of the 104, 106 types is a transparent planar structure, a multiple layered closure member 111, through which an observer person can gain visual access to an image generated by the remaining FIG. 1 elements. This multiple layered closure member 111 usually includes a lowermost layer 109 including a plurality of differing color filters as are indicated by the different shadings 126, 128, 130 and 132 shown in the FIG. 1A and FIG. 1B drawings and also an overlying layer 112 that may also be of lead oxide glass. The differing colors of emission emitted from the filters 128, 130 and 132 are indicated by the differently arrows at 134, 136, 138 and 140 in FIG. 1A. Immediately over the layer 109 is disposed an electrically conductive film layer 110 frequently made from transparent Indium Tin Oxide film and serving to conduct an electrical trigger pulse into the regions wherein the electrodes 116, 117 and 118 are closely adjacent, the region near the apex peak of the protuberances 104, 106 and so-on. These void regions intermediate the triangular cross section protuberances 104, 106 and so-on, the regions identified by the number 120 in FIG. 1, may be filled with plasma producing noble gas mixture such as ninety six percent Neon and four percent Xenon. The Xenon in this mixture is a larger molecule with more electrons in the valence shell and thus provides a "dopant" gas of relatively easy ionization capability, it may be of concentration between about four and ten percent. The Neon achieves a longer ionization persistence, it may have a concentration in the ninety to ninety six percent range; these same characteristics are often used in the Neon sign art. A top view of these FIG. 1 elements appears in the FIG. 1B drawing, however the FIG. 1A and FIG. 1B drawings are not of the vertically aligned features type as are frequently encountered in such paired drawings; this drawing arrangement is described later herein in connection with the FIG. 3 drawings.

Functional operation of the FIG. 1 plasma apparatus is indicated by the group of symbols shown at 114 in the FIG. 1 drawing. The sloping jagged lines 134 and 136 in this group of symbols indicates the presence of electrical field components between each of the electrodes 117 and 118 and the trigger layer 110 while the horizontal arrow 122 indicates a gas breakdown plasma discharge involving electric field-influenced particles within in the gases of the region 120 when this electric field is energized. These field influenced particles comprise the visual image components seen by an observer 142 looking at the FIG. 1 structure along the path 124 for example. The portions of this electric field provided by the electrodes 117 and 118 of course are present for the duration of a plasma discharge energization while the portion provided by the trigger pulse conducted on layer 110 is temporary and needed only to initiate the plasma discharge ionization providing the output image of the FIG. 1 plasma apparatus.

Notably the FIG. 1 described apparatus represents a visual display usage of a plasma discharge phenomenon Since the present invention involves gaseous plasma materials and the use of such plasma in order to control incident electromagnetic energy of either optical or radio frequency spectral range, the FIG. 1 described concepts and structures are of primarily background and underlying concept interest. A plurality of attributes of the FIG. 1 type of display nevertheless are believed worthy of consideration before embarking on a more detailed discussion of the present invention and its plasma details. One of these attributes concerns the fact that in the FIG. 1 arrangement of a display it is necessary for any incident energy, such as optical energy, arriving at the FIG. 1 apparatus along the viewing path 124, to pass through the multiple layered closure member 111 and in fact for this energy to make two such passes before returning to a location external of the display apparatus. In the normal plasma display usage plasma generated optical energy is employed and incident energy of this nature is often not present. In a plasma based energy deflection usage as contemplated herein however both input and output paths are need to traverse the closure member 111 and moreover these paths are most likely non orthogonal to the closure member 111 surface.

The lead oxide glass of the layer 112, the Indium tin oxide materials of the layer 110 and the colors of the layer 108 all as used in used in the member 111 combine to provide significant attenuation of such optical energy making the member 111 transition. The Indium tin oxide composition of the trigger conductor 110 and the need for an overlying electrode is found to be particularly undesirable for use in an infrared plasma based apparatus according to the present invention. The presence of electrical conductors both above and below the plasma filled regions at 120 in the FIG. 1 apparatus is also an undesirable characteristic of the FIG. 1 apparatus if it were to be used in a present invention infrared plasma application since the Indium Tin Oxide material is largely opaque to infrared energy.

Additionally in a FIG. 1-*like* structure it may be appreciated that the substrate 100 and the multiple layered closure member 111 materials are each of a rigid, and inflexible nature when composed of the recited materials and can also be of sufficient physical mass as to be unduly taxing in many possible usage situations of the FIG. 1 apparatus when the identified materials are used in their fabrication. Clearly lower mass, decreased optical loss and a more flexible nature for these materials are desirable goals for plasma apparatus improvement according to the present invention.

Figures 2, 2A, 2B:
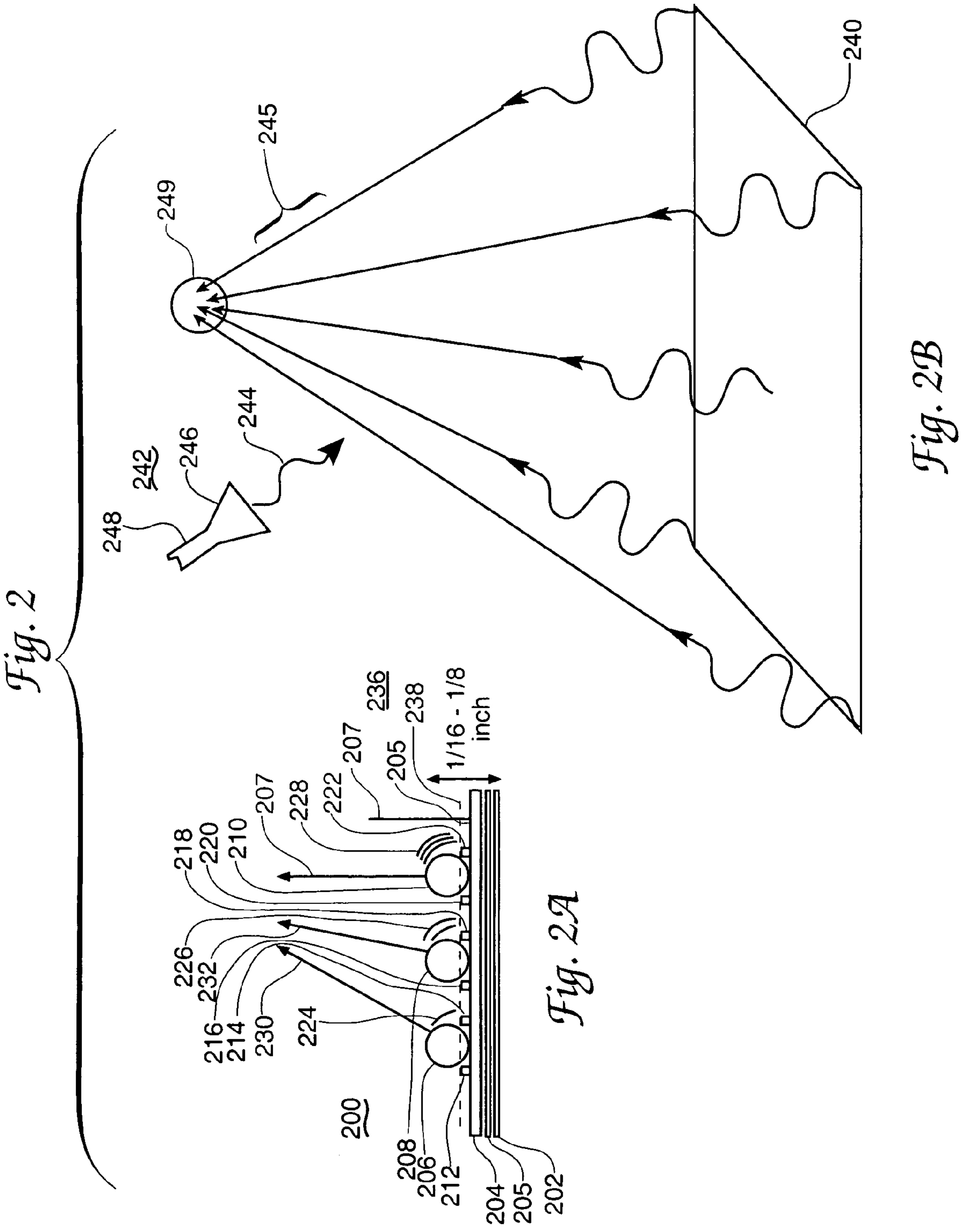
FIG. 2 includes the views of FIG. 2A, and FIG. 2B and shows conceptual views of a small plasma energy steering array according to the present invention.

FIG. 2 in the drawings includes the views of FIG. 2A and FIG. 2B and shows an idealized representation of an improvement according to the present invention, an apparatus usable in replacement of the FIG. 1 plasma display arrangement for the energy deflection purposes of the present invention. In the FIG. 2 drawing there is shown at 200 in FIG. 2A a cross sectional representation of a plasma apparatus usable for energy steering purposes while in FIG. 2B an apparatus of this type is shown, in simulated three dimensional perspective, in a radio frequency energy steering usage of the FIG. 2A apparatus. The FIG. 2A drawing includes a multiple layered substrate 203 that may be composed of an upper most flexible plastic material 204 overlying a piezoelectric material layer 205 together with for example a double sided sticky material layer 202 that may be used in mounting the substrate member 203 on a suitable supporting element. On the exposed surface 205 of the substrate member 203 are disposed three modules 206, 208 and 210 of plasma forming gas with this gas being contained in suitable gas enclosure members. The piezoelectric material layer 205 in the FIG. 2A drawing may be used as a reference for a normal vector 207 with respect to the illustrated apparatus, a vector from which a plasma steering angle may be measured.

Also shown in the FIG. 2A drawing are three sets of electrode pairs 212 and 214, 216 and 218, 220 and 222 representing an improved present invention arrangement for controlling plasma generation in the gas modules 206, 208 and 210. The curved symbols 224, 226 and 228 in FIG. 2A are used to indicate successively increasing degrees of plasma steering provided by successively increasing plasma density properties achieved in the modules 206, 208 and 210 as a result of differing electrical signals applied to the electrode pairs 212 and 214, 216 and 218, 220 and 222. The arrows of differing slope at 230, 232 originating in the modules 206, 208 and 210 indicate the differing degrees of for example radio frequency signal diversion achieved by differing gas densities in the modules 206, 208 and 210 as a result of differing electrode signal levels applied to electrode pairs 212 and 214, 216 and 218, 220 and 222. The dotted line at 238 in the FIG. 2A drawing is used to represent the reflecting plane boundary. Also shown at 236 in the FIG. 2A drawing is a range of thickness dimensions achievable for an energy steering embodiment of a plasma module apparatus. A notable aspect of the FIG. 2A structure is the possible physical flexibility it can have and the contrast this physical flexibility offers with respect to the FIG. 1 plasma apparatus.

Disposition of the plasma density and plasma electron density controlling electrodes 212 and 214, 216 and 218, 220 and 222 into the FIG. 2A illustrated position behind or at the lowermost surface of the plasma modules 206, 208 and 210 in FIG. 2A is a notable attribute of the present invention. For energy steering purposes it is desirable that in this location neither the input nor output radiant energy of the plasma modules need pass through lead oxide glass or other performance limiting materials found in the FIG. 1 plasma arrangement. Use of the plastic materials described in FIG. 2A in the FIG. 2B array is also notable in that the array 240 can be significantly lighter in weight and also provided with some degree of pre energization shaping in order to achieve better energy focus at a distant target such as 249 with use of the FIG. 2 invention arrangements. The FIG. 2A structure is also an improvement with respect to the rigid and inflexible nature of the FIG. 1A plasma apparatus.

FIG. 2B in the drawings shows use of a larger two dimensional array of plasma energy steering modules of the FIG. 2A type in a radio frequency energy steering application. In the FIG. 2B drawing the plasma steering array appears at 240 and a source of radio frequency electrical energy subject to reflective steering appears at 242. The source 242 may include an antenna horn 246 fed by a waveguide element 248 and emitting the radiant energy 244 toward the plasma reflection array 240. The reflection-steered output radio frequency energy is represented at 245 in the FIG. 2B drawing and the target upon which this steered radio frequency energy is impinged is shown at 249.

Figure 3A:
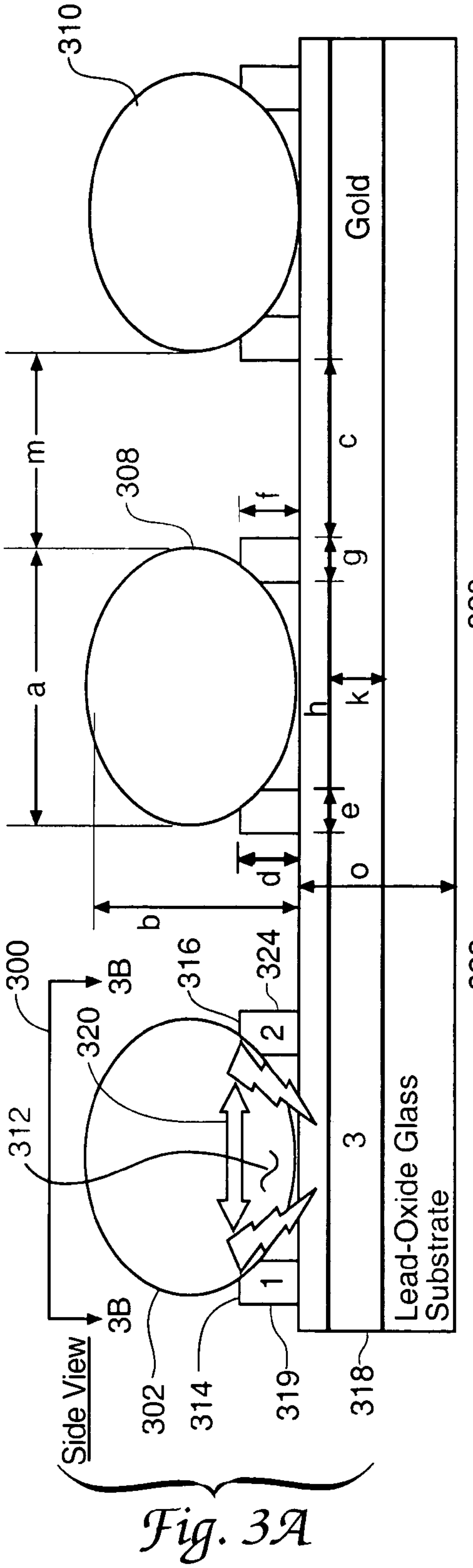
FIG. 3 includes the views of FIG. 3A
FIG. 3B shows two more detailed views of a plasma energy steering array according to the present invention.
Figure 3B:
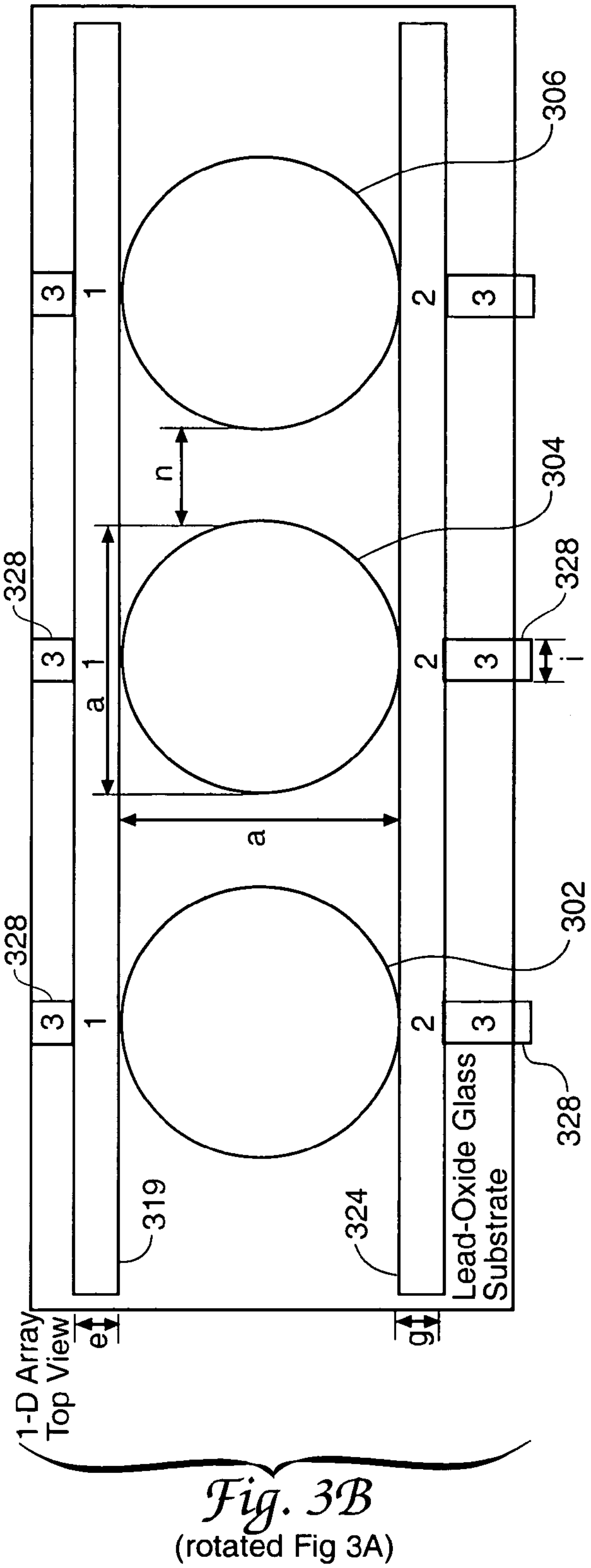

FIG. 3 in the drawings includes the views of FIG. 3A and FIG. 3B and shows details of an arrangement of the present invention that is of the FIG. 2 type but is of larger scale and arranged to reveal additional information concerning the plasma module electrodes and the conductors attending these electrodes. The FIG. 3A and FIG. 3B drawings represent side and top views of the plasma module respectively however, these views are somewhat unconventional in that the FIG. 3B side view is rotated by ninety degrees from that of the FIG. 3A view as is noted in the FIG. 3B drawings. The relationship between the FIG. 3A and FIG. 3B drawings is also indicated by the module identification numbers 302, 304, 306, 308 and 310 where upon consideration it may be appreciated that the module 302 appears in both FIG. 3A and FIG. 3B however the FIG. 3B modules 304 and 306 actually lie behind the module 302 in the FIG. 3A drawing. Additional effects of this drawing arrangement are provided by the two views of the address and sustain conductor 319, the sustain conductor 324 and the trigger conductor 328 appearing in the FIG. 3A and FIG. 3B drawings.

Significant other details of present invention plasma arrays first disclosed in the FIG. 3 drawings include the several module and conductor dimensions represented by the lower case letters between "a" and "o" appearing within dimension lines of the two drawings. Typical numeric values for these letter indicated dimensions appear in the Table 1 data presented below. The symbols at 312 in FIG. 3A are similar to the like symbols appearing at 114 in the FIG. 1 drawing and again indicate the electrical field and the plasma path appearing in the FIG. 3 modules.

TABLE 1

| | | |
|---|---|---|
| a | 200 to 2000 microns | $2.0 * 10^{-4}$ meters to $2.0 * 10^{-3}$ |
| b | 200 t0 2000 microns | $2.0 * 10^{-4}$ meters to $2.0 * 10^{-3}$ |
| c = (m) − (2 | 6 to 10 mils depending on (m) | $15.24 * 10^{-5}$ meters to $25.4 * 10^{-5}$ |
| d | 16000 Å | $1.6 * 10^{-6}$ meters |
| e = g = j | 2 mils | $5.08 * 10^{-5}$ meters |
| f | 16000 Å | $1.6 * 10^{-6}$ meters |
| g = e = j | 2 mils | $5.08 * 10^{-5}$ meters |

TABLE 1-continued

| | | |
|---|---|---|
| h | 1 mils | $2.54 * 10^{-5}$ meters |
| j = e = g | 2 mils | $5.08 * 10^{-5}$ meters |
| k | 16000 Å | $1.6 * 10^{-6}$ meters |
| m = 1/(# pixels per inch) | 12 mils (83 ppi) may be as low as 8 mils (120 | 30.48 * 10−5 meters (83 ppi) May be as low as 20.32 * 10−5 |
| n = a | 3 to 4 mils | $7.62 * 10^{-5}$ meters to $10.16 * 10^{-5}$ |
| o | 0.22 inches | $5.588 * 10^{-3}$ meters |

Dielectric Constant can be k = 16 for most materials. Dielectric Constant for spheres is between 4 and 14. 60 kHz operating switching to elements of sustain and address.
1 mil = $2.54 * 10^{-5}$ meters
1 Å = $1 * 10^{-10}$ meters
1 micron = $10^{-6}$ meters
1 inch = $2.54 * 10^{-2}$ meters FIG. 4 in the drawings shows a top view of an alternate electrode arrangement usable with plasma arrays according to the present invention. In the FIG. 4 drawing each of the plasma modules 400, 402, 404 and so-on is located above a pair of partial circle-shaped plasma generating electrodes such as appear at 406 and 408 for the plasma module 400. The electrodes 406 and 408 may be mounted on a substrate 422 of material such as a lead-oxide glass. The electrodes 406 and 408 may be connected with the illustrated conductor lines 410 and 412 by intermediate conductors such as 414 and 416 located below the substrate 422 along with the conductor lines 410 and 412. The intermediate conductors 414 and 416 emerge from below to above the substrate 422 at the locations 424, 426, 428 and 430 to join the electrodes such as 406, 408 by way of uppermost portions of the intermediate conductors. Representative dimensions for the FIG. 4 shown plasma array may be according to the above TABLE 1.

Figure 5:
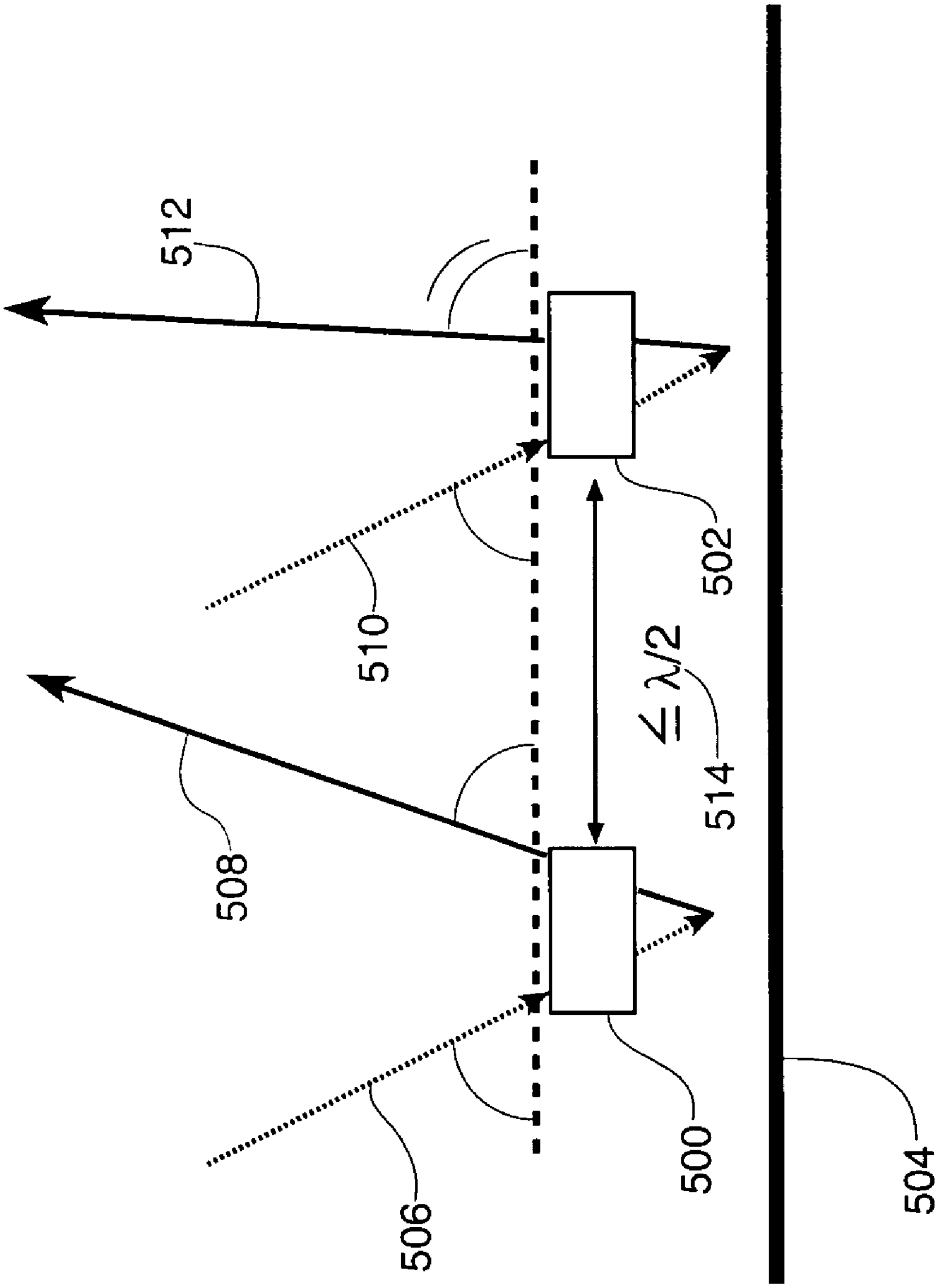
FIG. 5 shows present invention energy steering accomplished with plasma elements and a reflector element.

FIG. 5 in the drawings shows a schematic diagram of an arrangement for the present invention wherein radiant electromagnetic energy steering is accomplished with the combination of a plasma element and a reflector element. In the FIG. 5 apparatus input energy beams are received along the paths 506 and 510 and directed through plasma phase shifting elements 500 and 502 prior to being reflected from the ground plane and mirror element 504 for another pass through the phase shifting elements 500 and 502 and output along the paths 508 and 512. As indicated at 514 in FIG. 5 the phase shifting elements 500 and 502 are preferably disposed in a pattern of less than or equal to one half wavelength separation distances. It is notable that the phase shift elements 500 and 502 in the FIG. 5 apparatus are of the radiant energy pass through type and that these elements are made more effective through double pass exposure of the radiant energy to the plasma steering action.

Figure 4:
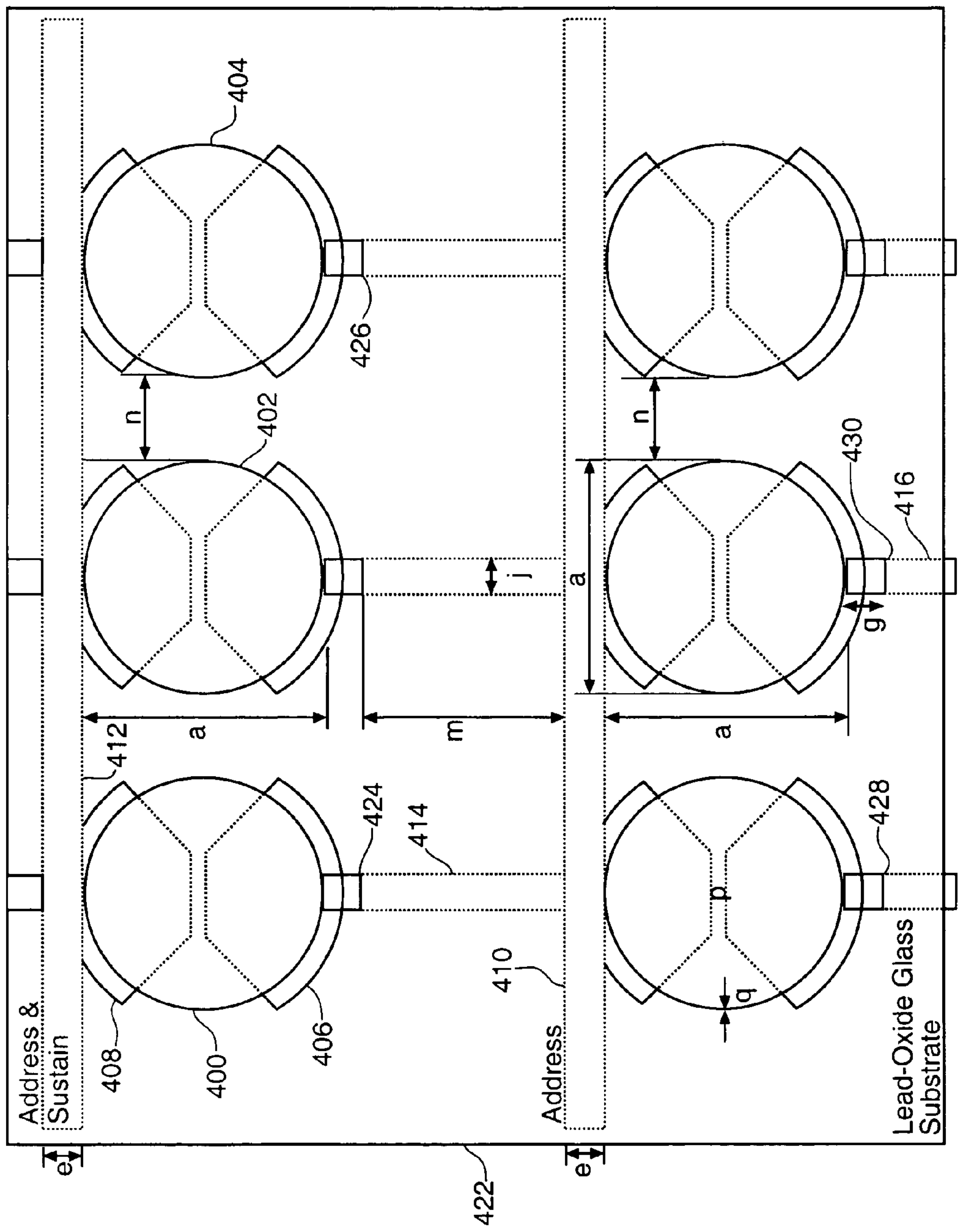
FIG. 4 shows an electrode arrangement for radio frequency energy reflecting plasma modules according to the present invention.

The FIG. 2 through FIG. 4 arrangements of the present radiant energy steering invention may be observed to have ready application to the steering of energy located in the radio frequency portions of the energy spectrum. Next we consider arrangements of the invention having application to a higher frequency portion of the electromagnetic spectrum, i.e., to an optical portion wherein the wavelengths involved are considerably shorter. Thus FIG. 7 in the drawings shows a plasma energy steering array according to the invention as such an apparatus may be arranged for reflection steering of an infrared energy beam. In the FIG. 7 drawing the energy steered is of this infrared spectral location and moreover is steered by reflection directly from the plasma material for example. Other steering arrangements may also be achieved with the FIG. 7 apparatus as described subsequently. In the FIG. 7 drawing there is shown at 700 in FIG. 7A the mounting of the reflective plasma beam steering element 708 on a carrier member 702, a carrier member that may also include plasma electrode driver circuits and other apparatus. The input electromagnetic energy beam being steered is represented at 704 in FIG. 7A and the reflected or steered output beam appears at 706.

Figures 7, 7A, 7B, 7C:
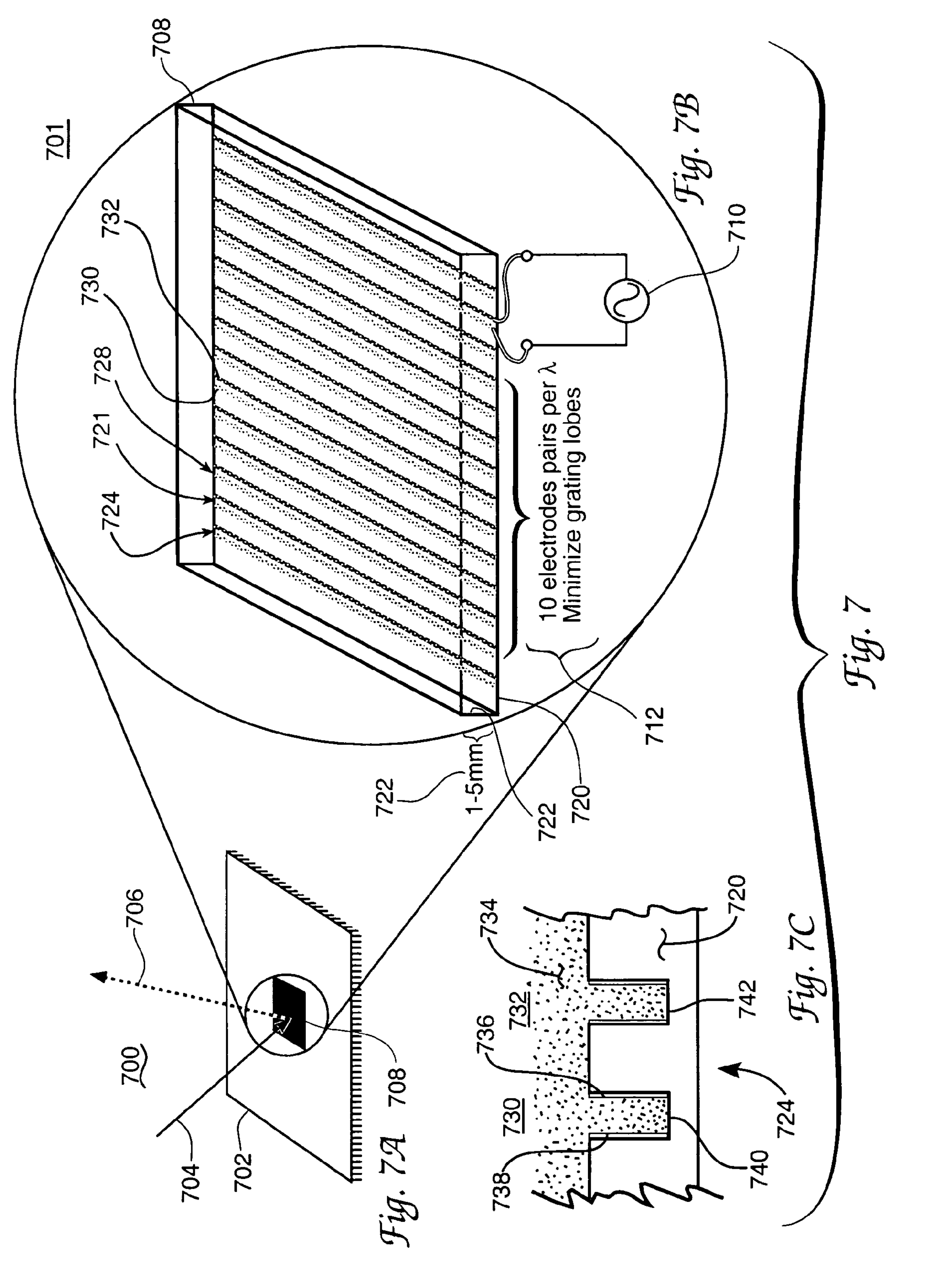
FIG. 7 includes the views of FIG. 7A, FIG. 7B and FIG. 7C and represents a plasma array according to the present invention usable for reflective plasma energy steering.

At 701 in FIG. 7B of FIG. 7 there is shown an enlarged and see-through view of the plasma beam steering element 708 in FIG. 7A wherein the control electrode pairs 724, 726, 728, 730 and 732 are visible. Also shown in the FIG. 7B drawing is the substrate member 720 used to hold the electrode pairs in a fixed position and a space 722 above this substrate where the plasma forming noble gas mixture is received; as indicated at 723 in FIG. 7B this space is preferably on the order of 1 to 5 millimeters in size. The noble gas mixture used in the space 722 may contain ninety percent Neon and ten percent Xenon gases for example. The FIG. 7B control electrode pairs 724, 726, 728, 730 and 732 are coupled to a source of plasma density controlling electrical potential shown at 710 in order to dynamically vary the amount of beam deflection steering achieved by the FIG. 7 apparatus. As indicated at 712 in FIG. 7B the electrode pairs may be disposed at pair to pair separation distances of about 10 electrode pairs per wavelength for the effective infrared wavelength energy reflection control desired.

FIG. 7C in the FIG. 7 group shows an enlarged cross sectional view for two of the electrode pairs 730 and 732 in FIG. 7B and additional details of their arrangement. As appears in the FIG. 7C drawing the electrode pair 730 preferably includes the individual electrodes 736 and 738 and includes a vertical disposition for each of these electrodes along opposing sides of a trench member 740. A similar arrangement is used for the trench 732 and the electrode pair 742 as shown to the right of the trench 740. The trenches 740 and 742 are separated by the FIG. 7B described wavelength related distance and the later added plasma forming noble gas mixture is represented at 734. The FIG. 7C illustrated structure may be used with any of the described plasma reflection, plasma pass through or discrete reflector element arrangements of the invention with appropriate selection of the substrate 720 material and the electrode 736 and 738 material compositions for energy transmission characteristics.

Figures 8, 8A, 8B, 8C:
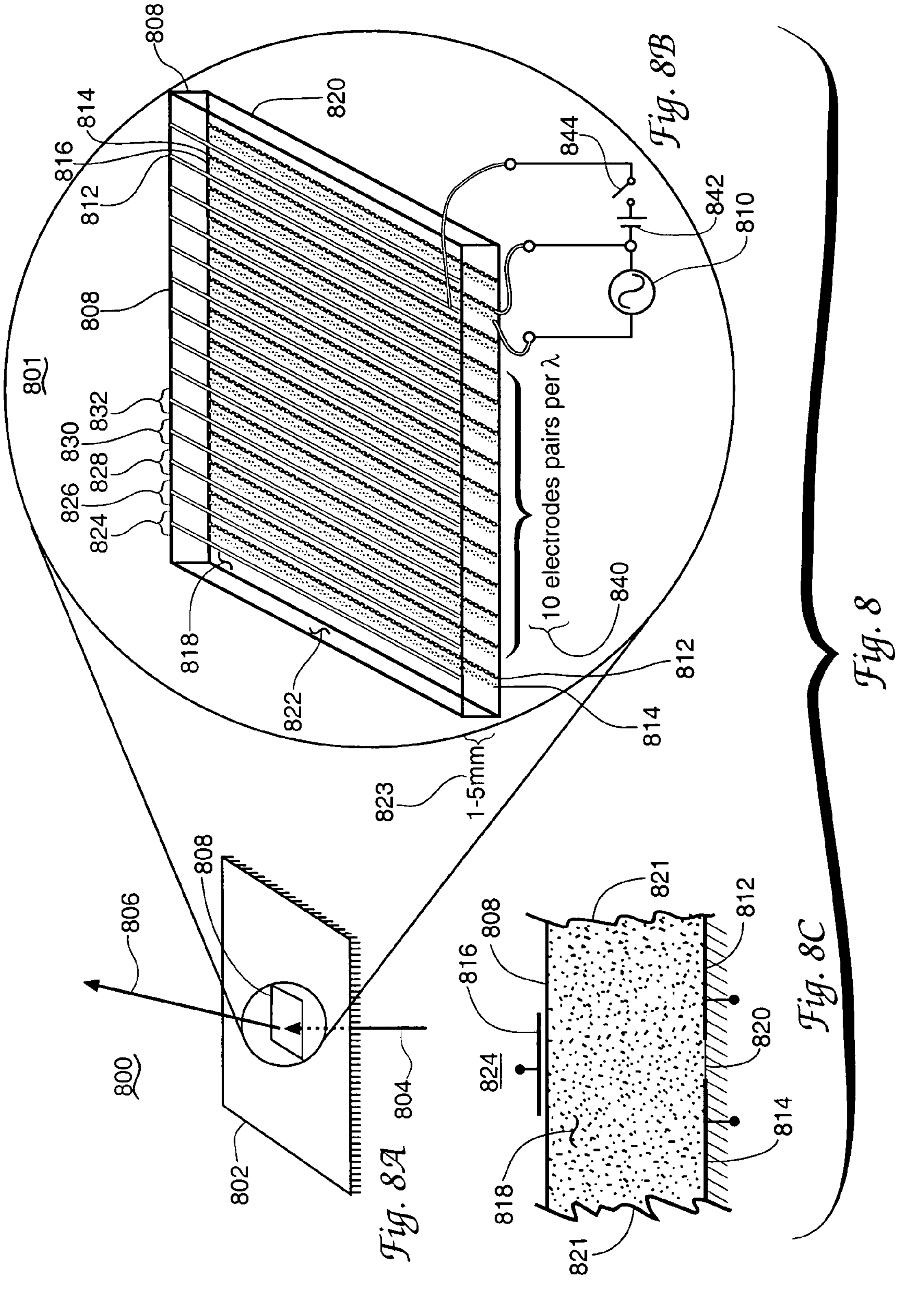
FIG. 8 includes the views of FIG. 8A, FIG. 8B and FIG. 8C and represents a plasma array according to the present invention usable for pass-through or transmissive or refractive energy steering.

In the manner of FIG. 7 herein the drawing of FIG. 8 shows three views of an additional present invention energy steering apparatus arranged to accomplish transmissive or refraction based or pass-through steering of infrared input energy. In the FIG. 8 drawing there is shown at 800 in FIG. 8A the mounting of the transmissive or pass through plasma steering element 808 on a carrier member 802, a carrier that may also include plasma electrode driver circuits and other apparatus. The input electromagnetic energy beam being steered is represented at 804 in FIG. 8A and the refracted or steered pass through output beam appears at 806.

At 801 in FIG. 8B of FIG. 8 there is shown an enlarged and see-through view of the plasma beam steering element 808 in FIG. 8A wherein the control electrode trios 824, 826, 828, 830 and 832 are visible. Also shown in the FIG. 8B drawing is the substrate member 820 used to hold the lower most electrode pairs of each trio in a fixed position and the space 822 above this substrate where the plasma forming noble gas mixture is received. As indicated at 823 in FIG. 8B this space is also preferably on the order of 1 to 5 millimeters in size. The noble gas mixture used in the space 822 may again contain ninety percent Neon and ten percent Xenon gases for example. The substrate 820 in the FIG. 8 transmissive arrangement of the invention is preferably made of an electrically insulating but radiant energy transmissive material such as glass or ruby. The FIG. 8B electrode trios 824, 826, 828, 830 and 832 are coupled to a source of plasma density controlling electrical potential shown at 810 in order to dynamically vary the amount of beam deflection steering achieved by the FIG. 8 apparatus. As indicated at 812 in FIG. 8B the electrode trios may be disposed at trio to trio separation distances of about 10 trios per wavelength for effective infrared wavelength energy reflection control.

The electrode trios shown in FIG. 8B and FIG. 8C are contemplated to operate by way of establishing a substrate surface 820 level energy-emitting electrical discharge between adjacent electrode pairs, between electrodes 812 and 814 for example, using electrical energy from the alternating current source 810. This discharge may continue for whatever length of time emission is desired. Termination of this discharge occurs by way of closing the switch 844 to supply energy from the source 842 to the third electrode 850 of this trio in order to draw one end point of the electrode 812 to 814 discharge away from its substrate surface 820 level path into a more vertical condition ending in the electrode 816. The greater length and the vertical orientation of this third electrode path results in extinction of the electrode 812 to 814 discharge. The discharge terminating energy source 842 is represented as a battery in the FIG. 8B drawing and of course may actually comprise a power supply source of direct current or other energy of sufficient voltage level to accomplish the described discharge relocation and extinction purpose.

FIG. 8C in the FIG. 8 group shows an enlarged cross sectional view of the electrode trio 812, 814 and 816 of the trio 824 in the FIG. 8B drawing and provides additional details of concerning the trio arrangement. As appears in the FIG. 8C drawing the electrode trio preferably includes the lowermost individual electrodes 812 and 814 at substrate level and the uppermost electrode 816 each of which is preferably made of a material such as Indium-Tin oxide that is both electrically conductive and transparent to the contemplated radiant infrared energy being steered by the FIG. 8 apparatus. The substrate surface 808 and the substrate break lines 821 are also shown in the FIG. 8C drawing along with the representation 818 of the ionizable media such as the noble gas mixture described in connection with the FIG. 8B drawing. During operation of the FIG. 8C steering trio it is contemplated that a first ionized plasma discharge, the usable discharge, occurs between the electrodes 812 and 814 as described above.

When viewed in combination the FIG. 7 and FIG. 8 drawings therefore demonstrate how electrode arrays may be used to establish discharges and alter the density of noble gas plasmas for steering radiant electromagnetic energy located in the infrared portion of the electromagnetic spectrum using either the reflection or the pass through steering mechanisms. The Indium Tin Oxide material identified previously herein as a conductor useful in electromagnetic energy transparent electrodes of a plasma device is actually useful in primarily radio frequency electromagnetic energy versions of the invention since this material is largely opaque to electromagnetic energy in the infrared portion of the spectrum.

With respect to the plasma modules shown at 206, 208 and 210 in the FIG. 2A and the achievement of such components in a fabricated radio frequency energy steering embodiment of the invention, applicants have achieved a structure of this type wherein a plasma forming mixture of noble gases is permanently confined within a large number of transparent enclosure modules through the aid of a supplier specializing in flat panel display technology. One supplier of this capability is identified as Imaging Systems Technology Incorporated (IST) of 4750 West Bancroft Avenue in Toledo, Ohio, USA.

Imaging Systems Technology Incorporated maintains a world wide web address; the current location of this address may be obtained from a search engine also available on the world wide web. Generally it may be stated that the individual modules or image pixels of plasma forming gasses supplied by Imaging Systems Technology Incorporated are identified with the name of "microspheres" or "Plasmaspheres"™, may be of widely varying physical size of (for example 1 mill to 10 mills or 25 microns to 250 microns) diameter and may include transparent microsphere enclosure walls of two percent or more of the microsphere diameter in thickness and can be made of glass or other material. Microsphere wall thicknesses of 80 to 150 microns are for example typical. Several of the patents identified in TABLE 2 and TABLE 3 below relate to structures in the nature of microspheres and the fabrication of such structures.

More specific details concerning the Imaging Systems Technology Incorporated microspheres, as may be used in embodiment of the present invention for example, including their energization and their use in arrays for visual display are disclosed in a series of U.S. patents involving one or more members of a family of the name "Wedding" and other persons who are associated with Imaging Systems Technology Incorporated as inventors. These U.S. patents are listed in Table 2 below and are hereby incorporated by reference herein.

TABLE 2

| Number | Issued | Inventor(s) | Subject |
|---|---|---|---|
| 5,793,158 | Aug. 11, 1998 | D. K. Wedding Sr. | Plasma channel display |
| 6,864,631 | Mar. 8, 2005 | D. K. Wedding | Microsphere display |
| 6,917,351 | Jul. 12, 2005 | B. K. Velayudhan et al. | Plasma display energization |
| 6,919,685 | Jul. 12, 2005 | T. M. Henderson et al. | Microspheres |

In addition to these Imaging Systems Technology Incorporated patents there exists a greater number of U.S. patents identified in these Imaging Systems Technology Incorporated patents and elsewhere and relating to plasma systems and their components. These U.S. patents are listed in Table 3 below and are hereby incorporated by reference herein.

TABLE 3

| Number | Issue Date | Inventor | Title |
|---|---|---|---|
| Re 25,791 | Jun. 8, 1965 | Claypoole | Composite article and method |
| 2,644,113 | Jun. 30, 1953 | Etzkorn | Shells with color emitting gas |
| 3,406,068 | Oct. 15, 1968 | Law | Mosaic screen |
| 3,499,167 | Mar. 3, 1970 | Baker et al. | Open discharge plasma cells |
| 3,559,190 | Jan. 26, 1971 | Bitzer et al. | AC plasma & phosphor |
| 3,602,754 | Aug. 31, 1971 | Pfaender et al. | Plasma panel with glass tubes |
| 3,603,836 | Sep. 7, 1971 | Grier | Conductor configurations |
| 3,607,169 | Sep. 21, 1971 | Coxe | Electrode energize, microsphere |
| 3,646,384 | Feb. 29, 1972 | Lay | Single substrate plasma cell |
| 3,654,680 | Apr. 11, 1972 | Bode et al. | Gas tubes form panel |
| 3,701,184 | Oct. 31, 1972 | Grier | Plasma electrodes |
| 3,716,742 | Feb. 13, 1973 | Nakayama et al. | Second electron materials |
| 3,801,861 | Apr. 2, 1974 | Petty et al. | Electrode energization |
| 3,803,449 | Apr. 9, 1974 | Schmersal | Electrode energization |
| 3,814,970 | Jun. 4, 1974 | Reboul | Gas discharge display panels |
| 3,836,393 | Sep. 17, 1974 | Ernsthausen et al. | MgO etc |
| 3,837,724 | Sep. 24, 1974 | Haberland, et al. | Plasma electrodes |
| 3,846,171 | Nov. 5, 1974 | Byrum Jr. | Gas discharge device |
| 3,848,248 | Nov. 12, 1974 | MacIntyre Jr. | Single substrate plasma cell |
| 3,856,525 | Dec. 24, 1974 | Inoue | Phosphor |
| 3,860,846 | Jan. 14, 1975 | Mayer | Electrically non-conducting substrate |
| 3,862,447 | Jan. 21, 1975 | De Vries et al. | Gas Fill |
| 3,886,390 | May 27, 1975 | Maloney | Dot matrix display |
| 3,886,404 | May 27, 1975 | Kurahashi et al. | X and Y electrodes |
| 3,896,327 | Jul. 22, 1975 | Schermerhorn | Single substrate plasma cell |
| 3,917,882 | Nov. 4, 1975 | Sheerk et al. | Glass composition |
| 3,923,530 | Dec. 2, 1975 | Sheerk et al. | Glass composition |
| 3,927,342 | Dec. 16, 1975 | Bode et al. | Gas tubes form panel |
| 3,932,783 | Jan. 13, 1976 | Menelly et al. | Indium oxide |
| 3,934,172 | Jan. 20, 1976 | Okamoto | Cathodes and electrodes |
| 3,964,050 | Jun. 15, 1976 | Mayer | Single substrate plasma cell |
| 3,969,718 | Jul. 13, 1976 | Strom | Plasma display with tubes |
| 3,990,068 | Nov. 2, 1976 | Mayer et al. | Plasma display w/capillary tubes |
| 3,998,618 | Dec. 21, 1976 | Kreick et al. | Gas-filled beads |
| 4,027,188 | May 31, 1977 | Bergman | Tubular plasma display |
| 4,035,689 | Jul. 12, 1977 | Ogle et al. | Gas filled cells |
| 4,035,690 | Jul. 12, 1977 | Roeber | Plasma gas in spheres |
| 4,038,577 | Jul. 26, 1977 | Bode et al. | Gas tubes form panel |
| 4,063,131 | Dec. 13, 1977 | Miller | Electrode energization |
| 4,080,597 | Mar. 21, 1978 | Mayer | Single substrate plasma cell |
| 4,087,805 | May 2, 1978 | Miller | Electrode energization |
| 4,087,807 | May 2, 1978 | Miavecz | Electrode energization |
| 4,121,133 | Oct. 17, 1978 | Ernsthausen | Multiple gaseous discharge |
| 4,126,807 | Nov. 21, 1978 | Wedding | Rare earth materials |
| 4,126,809 | Nov. 21, 1978 | Wedding et al. | Rare earth materials |
| 4,128,901 | Dec. 5, 1978 | Miller | Ground reference power supply |
| 4,130,779 | Dec. 19, 1978 | Miller, et al. | Gas discharge device |
| 4,132,982 | Jan. 2, 1979 | Byrum, et al. | Gaseous display device |

TABLE 3-continued

| Number | Issue Date | Inventor | Title |
|---|---|---|---|
| 4,133,939 | Jan. 9, 1979 | Bokerman, et al. | Silicone release coating |
| 4,146,665 | Mar. 27, 1979 | Ernsthausen | Gas discharge device |
| 4,205,392 | May 27, 1980 | Byrum, Jr., et al. | Gas discharge device |
| 4,224,553 | Sep. 23, 1980 | Hellwig | Gas discharge device |
| 4,233,623 | Nov. 11, 1980 | Pavliscak | Gas discharge display |
| 4,303,732 | Dec. 1, 1981 | Torobin | MgO Introduction, microspheres |
| 4,307,169 | Dec. 22, 1981 | Matkan | Microspheres |
| 4,320,418 | Mar. 16, 1982 | Pavliscak | Electrode matrix of light |
| 4,325,002 | Apr. 13, 1982 | Kobale et al. | Flat image display devices |
| 4,349,456 | Sep. 14, 1982 | Snowman | Electrode energization |
| 4,423,349 | Dec. 27, 1983 | Nakajima et al. | Fluorescence-emitting material |
| 4,429,303 | Jan. 31, 1984 | Aboelfotoh | Gaseous discharge display |
| 4,494,038 | Jan. 15, 1985 | Wedding et al. | Rare earth materials |
| 4,532,505 | Jul. 30, 1985 | Holz, et al. | Gas filled dot matrix |
| 4,611,203 | Sep. 9, 1986 | Criscimagna et al. | Electrode energization |
| 4,683,470 | Jul. 28, 1987 | Criscimagna et al. | Electrode energization |
| 4,692,662 | Sep. 8, 1987 | Wada et al. | Light emitting cells |
| 4,772,884 | Sep. 20, 1988 | Webber et al. | Electrode energization |
| 4,827,186 | May 2, 1989 | Knauer et al. | Phosphor Islands |
| 4,866,349 | Sep. 12, 1989 | Weber, et al. | MOSFET drivers |
| 4,926,095 | May 15, 1990 | Shinoda et al. | Three component gas mixture |
| 4,963,792 | Oct. 16, 1990 | Parker | Self contained gas discharge |
| 5,075,597 | Dec. 24, 1991 | Salavin | Coplanar sustaining AC type of plasma panel |
| 5,081,400 | Jan. 14, 1992 | Weber et al. | Sustain drivers for plasma panels |
| 5,086,297 | Feb. 4, 1992 | Miyake et al. | Fluorescent screen for plasma display |
| 5,107,182 | Apr. 21, 1992 | Sano et al. | Discharge gas spaces |
| 5,182,489 | Jan. 26, 1993 | Sano | Plasma display with increased brightness |
| 5,326,298 | Jul. 5, 1994 | Hotomi | Light emitter |
| 5,438,290 | Aug. 1, 1995 | Tanka | Low power driver circuit |
| 5,446,344 | Aug. 29, 1995 | Kanazawa | Electrode energization |
| 5,500,287 | Mar. 19, 1996 | Henderson | Gas in microspheres |
| 5,501,871 | Mar. 26, 1996 | Henderson | Microspheres |
| 5,541,479 | Jul. 30, 1996 | Nagakubi | Plasma display device |
| 5,541,618 | Jul. 30, 1996 | Shinoda | Electrode energization |
| 5,611,959 | Mar. 18, 1997 | Kijima | Aluminate phosphor |
| 5,640,068 | Jun. 17, 1997 | Nagakubi | Surface discharge plasma display |
| 5,642,018 | Jun. 24, 1997 | Marcotte | Energy efficient driver circuit |
| 5,651,920 | Jul. 29, 1997 | Chung-Nin et al. | (La, Ce, Tb) PO.sub.4 phosphors |
| 5,654,728 | Aug. 5, 1997 | Kanazawa et al. | AC plasma display unit |
| 5,661,500 | Aug. 26, 1997 | Shinoda et al. | Plasma gas in spheres |
| 5,670,974 | Sep. 23, 1997 | Ohba et al. | Dot matrix AC plasma |
| 5,674,553 | Oct. 7, 1997 | Shinoda et al. | Full color surface discharge |
| 5,724,054 | Mar. 3, 1998 | Shinoda | Electrode energization |
| 5,736,815 | Apr. 7, 1998 | Amemiya | Planar discharge plasma display |
| 5,742,122 | Apr. 21, 1998 | Amemiya et al. | Surface discharge plasma display |
| 5,745,086 | Apr. 28, 1998 | Webber | Electrode energization |
| 5,770,921 | Jun. 23, 1998 | Aoki | Alkaline earth oxide |
| 5,808,420 | Sep. 15, 1998 | Rilly et al. | Alternating current generator |
| 5,828,353 | Oct. 27, 1998 | Kishi, et al. | Triple-electrode planar |
| 5,914,563 | Jun. 22, 1999 | E. C. Lee et al. x | Electrode energization |
| 5,963,169 | Oct. 5, 1999 | Anderson | Plasma discharge tubes |
| 5,985,176 | Nov. 16, 1999 | Rao | Zinc orthosilicate phosphor |
| 5,989,454 | Nov. 23, 1999 | Rao | Small particle lanthanum |
| 5,990,837 | Nov. 23, 1999 | Anderson | Plasma discharge tubes |
| 5,998,047 | Dec. 7, 1999 | Bechtel et al. | Aluminate phosphor |
| 6,004,481 | Dec. 21, 1999 | Rao | Small particle yttrium |
| 6,042,747 | Mar. 28, 2000 | Rao | Phosphor, colors |
| 6,046,705 | Apr. 4, 2000 | Anderson | Plasma discharge tubes |
| 6,087,992 | Jul. 11, 2000 | Anderson | Plasma discharge tubes |
| 6,087,993 | Jul. 11, 2000 | Anderson | Plasma discharge tubes |
| 6,096,243 | Aug. 1, 2000 | Oshio et al. | Divalent europium-activated phosphor |
| 6,111,556 | Aug. 29, 2000 | Moon | Energy recovery sustain circuit |
| 6,118,407 | Sep. 12, 2000 | Anderson | Plasma discharge tubes |
| 6,169,520 | Jan. 2, 2001 | Anderson | Plasma discharge tubes |
| 6,187,225 | Feb. 13, 2001 | Rao | Stable phosphor complex |
| 6,198,476 | Mar. 6, 2001 | J. W. Hong, et al. | Electrode energization |
| 6,200,496 | Mar. 13, 2001 | Park et al. | Low-voltage excited white phosphor |
| 6,200,497 | Mar. 13, 2001 | Park et al. | Low-voltage excited pink phosphor |
| 6,208,081 | Mar. 27, 2001 | Y. P. Eo et al. | Apparatus for driving plasma display panel |
| 6,217,795 | Apr. 17, 2001 | Yu et al. | Low voltage blue emitting phosphor |
| 6,255,777 | Jul. 3, 2001 | Kim et al. | Capillary glass tube PDP |
| 6,265,825 | Jul. 24, 2001 | Asano | Up-conversion phosphor |
| 6,284,155 | Sep. 4, 2001 | Rao | Small particle red emitting phosphors |

TABLE 3-continued

| Number | Issue Date | Inventor | Title |
|---|---|---|---|
| 6,284,848 | Sep. 4, 2001 | Durand et al. | Gas phase polymerization process |
| 6,285,129 | Sep. 4, 2001 | Park, et al. | Helium plasma display device |
| 6,290,875 | Apr. 18, 2001 | Oshio et al. | Earth ion-containing aluminate phosphor |
| 6,316,777 | Nov. 13, 2001 | Anderson | Plasma discharge tubes |
| 6,322,725 | Nov. 27, 2001 | Yu et al. | Low-voltage excited blue phosphor |
| 6,369,763 | Apr. 9, 2002 | Anderson | Plasma discharge tubes |
| 6,400,343 | Jun. 4, 2002 | Zorzan, et al. | Electric potential signals |
| 6,423,248 | Jul. 23, 2002 | Rao, et al. | Green emitting alkaline earth aluminate phosphor |
| 6,459,201 | Oct. 1, 2002 | Schermerhorn et al. | Hermetically sealed gas filled enclosure |
| 6,512,496 | Jan. 28, 2003 | Anderson | Plasma discharge tubes |
| 6,538,627 | Mar. 25, 2003 | Whang et al. | Energy recovery driver circuit |
| 6,545,422 | Apr. 8, 2003 | George et al. | Plasma display panel |
| 6,570,335 | May 27, 2003 | George et al. | Spherical plasma display |
| 6,597,120 | Jul. 22, 2003 | Schemerhorn, et al. | Controlled sustaining electrodes |
| 6,612,889 | Sep. 2, 2003 | Green et al. | Spherical plasma display |
| 6,620,012 | Sep. 16, 2003 | Johnson et al. | Spherical plasma display |
| 6,624,719 | Sep. 16, 2003 | Anderson | Plasma discharge tubes |
| 6,646,388 | Nov. 11, 2003 | George et al. | Spherical plasma display |
| 6,650,297 | Nov. 18, 2003 | Anderson | Plasma discharge tubes |
| 6,657,594 | Dec. 2, 2003 | Anderson | Plasma discharge tubes |
| 6,674,970 | Jan. 6, 2004 | Anderson | Plasma discharge tubes |
| 6,700,544 | Mar. 2, 2004 | Anderson | Plasma discharge tubes |
| 6,710,746 | Mar. 23, 2004 | Anderson | Plasma discharge tubes |
| 6,762,566 | Jul. 13, 2004 | George et al. | Spherical plasma display |
| 6,764,367 | Jul. 20, 2004 | Green et al. | Spherical plasma display |
| 6,788,004 | Sep. 7, 2004 | Aoki et al. | Luminous characteristics |
| 6,791,264 | Sep. 14, 2004 | Green et al. | Spherical plasma display |
| 6,796,867 | Sep. 28, 2004 | George et al. | Spherical plasma display |
| 6,801,001 | Oct. 5, 2004 | Drobot et al. | Spherical plasma display |
| 6,806,833 | Oct. 19, 2004 | Anderson | Plasma discharge tubes |
| 6,812,895 | Nov. 2, 2004 | Anderson | Plasma discharge tubes |
| 6,822,626 | Nov. 23, 2004 | George et al. | Spherical plasma display |
| 6,825,606 | Nov. 30, 2004 | Schermerhorn et al. | Independent trigger and controlled sustaining electrodes |
| 6,850,256 | Feb. 1, 2005 | Crow et al. | User interface |
| 6,870,517 | Mar. 22, 2005 | Anderson | Plasma discharge tubes |
| 6,876,330 | Apr. 5, 2005 | Anderson | Plasma discharge tubes |
| 6,902,456 | Jun. 7, 2005 | George et al. | Spherical plasma display |
| 6,909,225 | Jun. 21, 2005 | Irie et al. | Gas discharge display device |
| 6,922,173 | Jul. 26, 2005 | Anderson | Plasma discharge tubes |
| 6,935,913 | Aug. 30, 2005 | Wyeth ea | Spherical plasma display |
| 6,949,887 | Sep. 27, 2005 | Kirkpatrick et al. | Inductive lamp and power oscillator |
| 6,975,068 | Dec. 13, 2005 | Green et al. | Spherical plasma display |
| 6,975,086 | Dec. 13, 2005 | Honda, et al. | Positioning control method |
| 7,023,405 | Apr. 4, 2006 | Awamoto et al | Luminance and light emission efficiency |
| 7,023,406 | Apr. 4, 2006 | Nunomura et al. | Peak luminance |
| JAP11238469A | | | |
| 20010028216A1 | Oct. 11, 2001 | Tokai et al. | Elongated illuminators |
| 20010033207 | Oct. 25, 2001 | Anderson | Plasma discharge tubes |
| 20020017863 | Feb. 14, 2002 | Kim et al. | Capillary glass tube |
| 20020093460 | Jul. 18, 2002 | Anderson | Plasma discharge tubes |
| 20020041157 | Apr. 11, 2002 | Heo | Microsphere size, phosphor color |
| 20030142021 | Jul. 31, 2003 | Anderson | Plasma discharge tubes |
| 20030146879 | Aug. 7, 2004 | Anderson | Plasma discharge tubes |
| 20030160724 | Aug. 28, 2003 | Anderson | Plasma discharge tubes |
| 20030193436 | Oct. 16, 2003 | Anderson | Plasma discharge tubes |
| 20030193435 | Oct. 16, 2003 | Anderson | Plasma discharge tubes |
| 20040004445 | Jan. 8, 2004 | George et al. | Spherical plasma display |
| 20040061650 | Apr. 1, 2004 | Anderson | Plasma discharge tubes |
| 20040063373 | Apr. 1, 2004 | Johnson et al. | Spherical plasma display |
| 20040106349 | Jun. 3, 2004 | Green et al. | Spherical plasma display |
| 20040130497 | Jul. 8, 2004 | Anderson | Plasma discharge tubes |
| 20040166762 | Aug. 26, 2004 | Green et al. | Spherical plasma display |
| 20040227682 | Nov. 18, 2004 | Anderson | Plasma discharge tubes |
| 20050057432 | Mar. 17, 2005 | Anderson | Plasma discharge tubes |
| 20050095944 | May 5, 2005 | George et al. | Spherical plasma display |
| 20050110691 | May 26, 2005 | Anderson | Plasma discharge tubes |
| 20050206317 | Sep. 22, 2005 | George et al. | Spherical plasma display |
| 20050280372 | Dec. 22, 2005 | Anderson | Plasma discharge tubes |

Although the documents identified in Table 2 and Table 3 above relate to several aspects of plasma visual display devices including such details as the fabrication of pixel microspheres, the contents of pixel microspheres, illumination generating coatings for microspheres, microsphere electrode fabrication, electrical energization of plasma in pixel microspheres and the generation of different visual colors in a microsphere enclosure (using a plurality of concepts) it should be appreciated that these aspects are in fact related to such display usage of the plasma device and may be distinguishable from an energy steering usage of the plasma device as espoused in the present invention. Thus while these patents provide teaching of plasma related concepts believed helpful for supporting disclosure purposes in connection with the present invention, they are believed free of anticipation and obviousness implications with respect to the present invention.

Figure 9A:
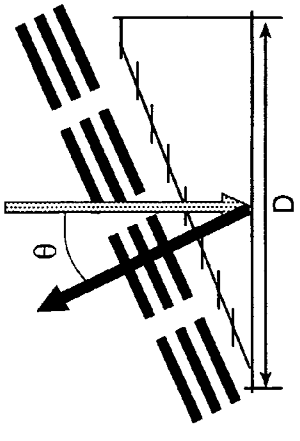
FIG. 9 includes the views of FIG. 9A, FIG. 9B and FIG. 9C and shows three theoretical concepts useful in an understanding of the invention.
Figure 9B:
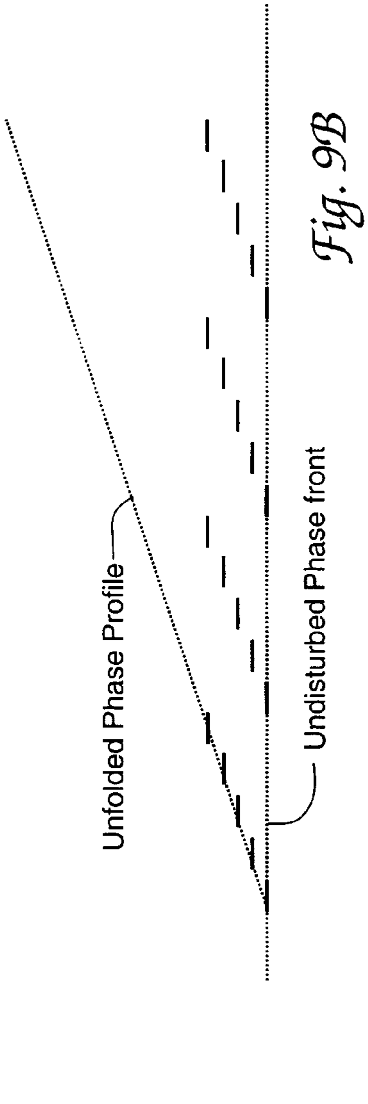
Figure 9C:
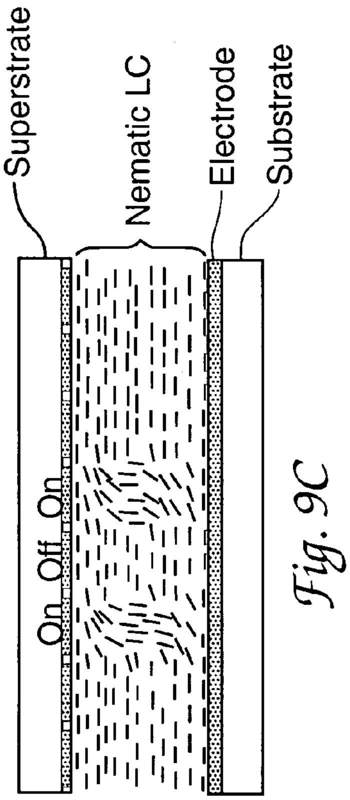

Along with these discussions of specific arrangements for accomplishing the present invention in widely separated portions of the electromagnetic spectrum it may be helpful to consider briefly certain theoretical concepts supporting each of these arrangements. The object of the plasma is to create different optical path lengths within each pixel or cell in order to digitally synthesize a linear prism. Such a prism may also be identified as a Blaze-Grating and is represented in FIG. 9A and FIG. 9B herein. In these drawings the plasma at the right end of the depicted Blaze Grating is influenced by electrodes of greater potential than at the left end of the grating and an in fact phase shift grating is thus achieved. FIG. 9C shows a liquid crystal analog of three gratings in a comparable liquid crystal phase shifter and the crystal orientations achieved by related grating electrodes.

The way in which a beam is steered in this manner may be predicted mathematically using equation 4.2 as shown below. The amount of phase-delay in wavelengths, m, is usually on the order of one (1), but a higher order will allow for better bandwidth. The wavelength, λ, for the purposes of this document is either between 15 centimeters (2 gigahertz) and 1.7 centimeters (18 gigahertz) or between 1.5 micrometers and 11 micrometers for some infrared (IR) conditions. Finally the horizontal spacing D is between zero (0) wavelengths phase-delay and m·λ wavelengths phase-delay. Because this is done digitally, with discrete steps of optical path length for each pixel, there is a certain amount of efficiency that can be calculated as shown in equation 4.3.

$$\tan\theta = \frac{m\cdot\lambda}{D} \qquad \text{(EQ. 4.2)}$$

$$\eta = \left(\frac{\sin\left(\frac{\pi}{q}\right)}{\left(\frac{\pi}{q}\right)}\right)^2 \qquad \text{(EQ. 4.3)}$$

With the Blaze-Grating approach, more efficiency is gained by including more steps. The loss in efficiency is due to energy going into side-lobes and grating-lobes. The grating-lobes can be negated by engineering the pixel sizes such that a sufficient number of them (q) give an acceptable efficiency (h) in a length (D) that is less than the wavelength λ that is being phase shifted.

Using the Blaze-Grating approach, it is possible to take advantage of the 2p periodicity of an EM wave and repeat the Blaze-Grating profile. This also requires that m always be an integer, but nominally one (1). By repeating the profile, m can be kept small and large index of refractions are not necessary to achieve the required phase-delay.

Figure 10:
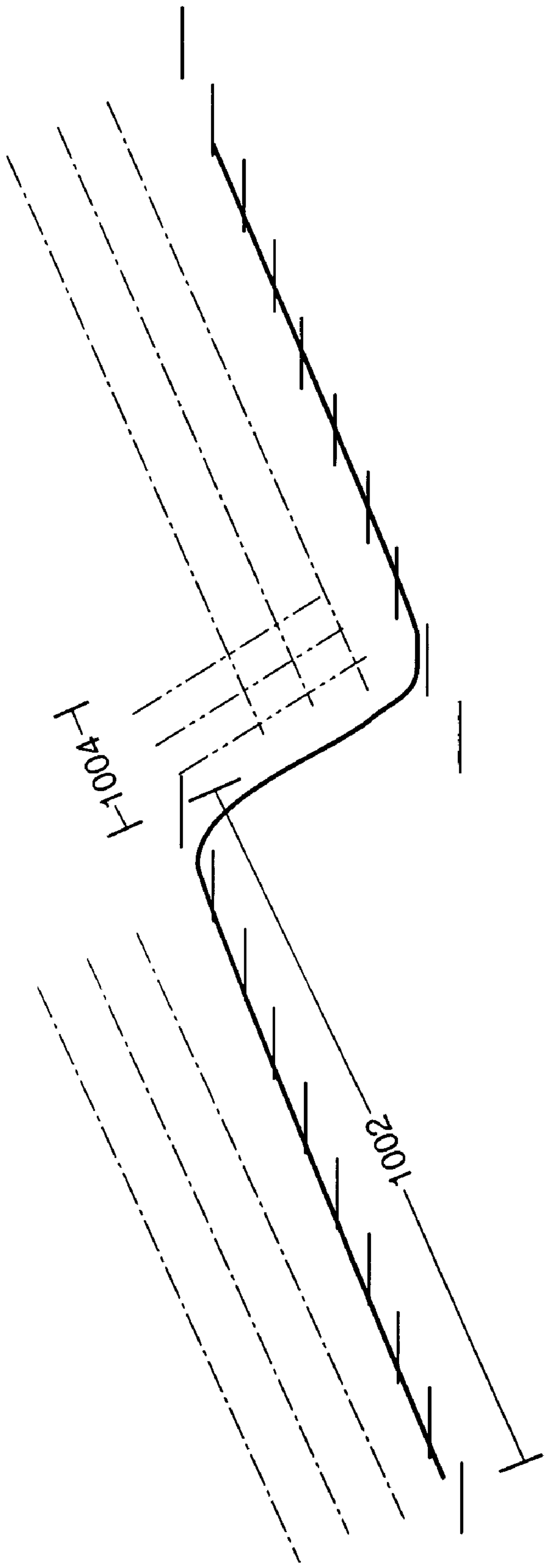
FIG. 10 shows a phase profile and related losses achieved with the present invention.

This method of Blaze-Grating energy steering does present challenges as side-lobes and grating-lobes are created as may be appreciated from the FIG. 10 drawing herein. In this FIG. 10 drawing electromagnetic energy arriving in the region 1002 is desirably steered by plasma encounter however energy arriving in the region 1004 is steered in an undesired direction. Also, fringe fields may have an impact. After the Blaze-Grating Profile has been established, it is necessary to create plasmas with these characteristics in each reflecting pixel. This entails that the plasma be very near in frequency to the wave that is being phase-delayed. Equation 4.4 is used to calculate the plasma frequency.

$$\omega_p^2 = \frac{n_0\cdot q_e^2}{\varepsilon_0}\left(\frac{1}{m_e}-\frac{1}{m_i}\right) \Rightarrow \frac{n_0\cdot q_e^2}{m_e\cdot\varepsilon_0} \qquad \begin{aligned} &\varepsilon_0 = 8.85\times10^{-12}\frac{F}{m}\\ &q_e - 1.602\times10^{-19}C\\ &m_e = 9.109\times10^{-31}\text{ kg}\\ &m_i \approx 10^{-27} \leftrightarrow 10^{-26}\text{ kg}\\ &\omega_P = 2\pi f_p \end{aligned} \qquad \text{(EQ 4.4)}$$

Plasma can be characterized by its frequency shown in equation 4.4. The mass of the ion, $m_i$ is generally so large that $1/m_i \approx 0$ when compared to $1/m_e$; this allows us to simplify to the second part of equation 4.4.

Gases in general also have a relation that needs to be characterized before further discussion; specifically, collision frequency or $\nu_c$, which is a function of the gas pressure. For simplicity, we will assume that temperature has little effect in our limited operating range close to Standard Temperature and Pressure (STP). This allows us to assume that the average collisional cross section is $$\rho \approx 3\times10^{16}\frac{\text{molecules}}{torr}.$$

with an average velocity of $$v \approx 10^8\frac{m}{s}$$

and a density of $$\rho \approx 3\times10^{16}\frac{\text{molecules}}{\text{torr}}$$

Our pressure will be moderate to allow for enough collisions to generate sufficient ionization without dampening an incoming EM wave's energy excessively. The pressure range that is best for X-band work is between 300 torr and 600 torr. For present purposes p=300 torr will be used. This gives us a collision frequency of $$v_\varepsilon = p*\rho*v*\sigma = 9\times10^{11}\frac{1}{s}.$$

For present purposes it is desirable to understand both circumstances in which an EM wave may be encountering a plasma; i.e., either over or under the plasma frequency. Santoru and Gregoire in their 15 Sep. 1993 Applied Physics article state the following for both circumstances through the use of equation 4.5 through equation 4.10.

$$\varepsilon_r = \left(1 - \frac{\omega_p^2}{\omega_0^2 + \nu_e^2}\right) - j\frac{\nu_c}{\omega_0}\left(\frac{\omega_p^2}{\omega_0^2 + \nu_e^2}\right) \quad \text{(EQ 4.5)}$$

$$k = k_0\sqrt{\varepsilon_p} = k_r + jk_jk_0 = \frac{\omega_0}{c} \quad \text{(EQ 4.6)}$$

$$k_r = k_0 \cdot r \cdot \cos\left(\frac{\phi}{2}\right) \quad \text{(EQ 4.7)}$$

$$k_j = k_0 \cdot r \cdot \sin\left(\frac{\phi}{2}\right) \quad \text{(EQ 4.8)}$$

$$r = \left[1 - \frac{\omega_p^2}{\omega_0^2 + \nu_c^2}\left(2 - \frac{\omega_p^2}{\omega_0^2}\right)\right]^{1/4} \quad \text{(EQ 4.9)}$$

$$\phi = \begin{cases} \tan^{-1}\left(\frac{-\nu_c \cdot \omega_p^2}{\omega_o(\omega_o^2 + \nu_c^2 - \omega_p^2)}\right), & \mathrm{Re}(\varepsilon_p) > 0 \\ \tan^{-1}\left(\frac{-\nu_c \cdot \omega_p^2}{\omega_o(\omega_o^2 + \nu_c^2 - \omega_p^2)}\right) + \pi, & \mathrm{Re}(\varepsilon_p) \le 0 \end{cases} \quad \text{(EQ 4.10)}$$

For present purposes, the boundary between the plasma and free space will be assumed to have a smooth transition with no reflection. In reality, with consideration of much more complexity, there will be a reflection portion from this boundary region as the change will be somewhat abrupt, depending upon the geometry and the electron density present.

The geometry of our FIG. 4 phase shifting device has a significant impact on our achieved beam steering capability. The FIG. 4 device contains the plasma in spheres that are 2 millimeters in diameter, but only 1 millimeter tall. The result is that most of the plasma plane is seemingly covered with plasma, however discrete it may be due to the individual plasma pixel cells. Another impact of this geometry is that the pixels are significantly smaller than the incoming electromagnetic wavelength in the FIG. 4 radio frequency instance. This allows for better efficiency. The final impact will be that the 1 millimeter thickness is sufficiently less than the wavelength to require an excessive amount of optical path length that is only achieved by driving the plasma over the incoming electromagnetic wave's frequency. This has the effect of attenuating the incoming electromagnetic wave.

The following calculations disclose the determination of plasma frequencies needed to steer a beam of a certain frequency.

1. Specify incoming electromagnetic wave frequency and convert to a radial frequency, radians per second, where f0 is the frequency of the incoming wave. $\omega_0 = 2\pi f_0$ 2. Solve for $k_0$, the k vector of the incident electromagnetic wave. $k_0 = \omega_0/c$ 3. Find the efficiency of the system, where q is the number of pixels in the distance D. The number of pixels, q, is recommended to be 8 or more for an ef:

$$\eta = \left(\frac{\sin\left(\frac{x}{q}\right)}{\left(\frac{x}{q}\right)}\right)^2$$

·ninety five percent.

4. Solve for m, the number of wavelengths to be shifted. m=tan θ=mλ/D a. Specify the angle of the beam to be steered, θ.

b. Specify the planar distance [proportional to the number of pixels, q] over which to phase shift, D.

c. Solve for the number of wavelengths to change the optical path by, m.

5. Using the previous relation and pixel size, compute m for each pixel by substituting the overall planar distance, D, with the distance between the first pixel and the one that is being calculated, d. Use center to center distances between pixels.

$$\tan\theta = \frac{m \cdot \lambda}{D}$$

6. Solve for the necessary kr.

$$k_r = k_o - \frac{m \cdot 2\pi}{\text{plasma thickness} = 1\text{ mm}}$$

7. Establish the pressure of the plasma and solve for collision frequency.

$$\nu_c = p * \rho * \nu * \sigma = 9 \times 10^{11}\frac{1}{s}\text{ for } p = 300$$

torr.

8. Plot $$k_r(\omega_p) = k_o \cdot r(\omega_p) \cdot \cos\left(\frac{r(\omega_p)}{2}\right)$$

and the kr determined previously to find their intersection. This will determine the plasma frequency. $\omega_p$.

9. Solve for the electron density of the required plasma, n0.

10. Repeat steps 5 through 9 for each pixel.

$$\omega_p^2 = \frac{n_0 \cdot q_r^2}{m_r \cdot \varepsilon_0}$$

The radio frequency embodiment of 2 gigahertz to 18 gigahertz frequency range produces cases that require the plasma frequency to be much larger than the incoming electromagnetic wave frequency. This is due to the excessively short distance, 1 millimeter, in which to create the necessary optical path distance for steering.

As has already been shown, the achieved amount of steering is inversely proportional to the number of pixels used. Using fewer pixels will make the planar distance, D, small, thus increasing q. However, the limit of efficiency must be remembered and no less than 8 pixels are suggested to minimize side lobes. Since the pixel sizes are much less than the wavelength and the planar distance, D, is most likely going to be less than a wavelength with each pixel being two millimeters wide for RF applications, the grating lobes are not present. Further, the amount of steering is directly proportional to the amount of phase shift due to an increase in the optical path length.

These relations give a means to create the beam steering angle via two (2) methods.

1. Vary the planar distance, D. An increase in D will create better efficiency but less beam steering capability if the maximum optical path length limit is reached.

2. Vary the amount of optical path length, m. The electromagnetic wave frequency will be below the plasma frequency for the radio frequency case and the most minimal amount of optical path length change will be needed to avoid any more attenuation than is necessary.

A plasma antenna board that has been fabricated is 30 pixels high by 40 pixels wide or approximately 3"×4" as the pixels are 2 millimeters wide. The plasma spheres are 1 millimeter tall from the electrode plane below them. However, as the incident electromagnetic wave will travel through the plasma spheres twice, once towards the electrode plane and once away from the electrode plane after reflection, the distance through the plasma is doubled to 2 millimeters. This is good for the prototype as it will require a lower plasma electron density to create the required phase delay. The distance of 2 millimeters of plasma is still sufficiently less than any of the wavelengths between 2 GHz (15 cm) and 18 GHz (1.7 cm) to assure the resulting plasma frequency will be much greater than the incident electromagnetic wave.

It is desirable to examine what the maximum plasma density required will be. To set a simple limit of maximum plasma frequency on the system, we consider that we will need a minimum of 2p phase delay, or m=1. A larger phase shift, m, would result in more bandwidth as will be examined in the infrared case but would also require a larger plasma frequency and a resulting electron density. The plasma frequency is already expected to be much greater than the incident electromagnetic wave, which is expected to cause some attenuation. Larger phase delays where m>1 require the plasma frequency to be even higher, causing even more attenuation. As this is unacceptable, only the case where m=1 is examined here in TABLE 4.

TABLE 4

(m = 1)

| $f_0\left(\frac{1}{s}\right)$ | λ (m) | $k_0$ | $k_p$ | $\omega_p\left(\frac{rad}{s}\right)$ | $n_0\left(\frac{\#\ electrons}{cm^3}\right)$ |
|---|---|---|---|---|---|
| 2 GHz | 15 cm | 41.9158 | −3099.68 | 1.200400*$10^{13}$ | 3.942330*$10^{16}$ |
| 8 GHz | 3.75 cm | 167.6630 | −2973.93 | 0.549079*$10^{13}$ | 0.947448*$10^{16}$ |
| 12 GHz | 2.5 cm | 251.4950 | −2890.10 | 0.442214*$10^{13}$ | 0.614541*$10^{16}$ |
| 18 GHz | 1.7 cm | 377.2430 | −2764.35 | 0.353320*$10^{13}$ | 0.392302*$10^{16}$ |

The electron densities required for 2p phase delay are large but possibly obtainable. At best, it is possible to ionize roughly one percent of all of the available particles of the gas. As 300 torr pressure contains only 9*$10^{18}$ molecules per $cm^3$, these densities require almost one percent of the gas to be ionized. This method is therefore possible to use to employ plasma as an effective phase delay via optical path length.

The best case scenario is to have the incident electromagnetic wave at a frequency such as to minimize the plasma frequency requirement for the designated geometry of a two millimeter deep plasma. This case has been found to be just above 76 gigahertz, where the wavelength is about four millimeters. At this frequency, the plasma may be adjusted to its lowest level of $\omega_p$=1.02*$10^{12}$ radians/second or a plasma electron density of $n_e$=0.0326*$10^{16}$ # electrons/$cm^3$. This requires roughly 0.004% of the gas to be ionized, a feat that is easily achieved. However, the wavelength is sufficiently small that the plasma spheres are now only half of the incident electromagnetic wave length. This will cause more loss in efficiency due to possible grating lobes.

In the case of infrared electromagnetic energy, the wavelengths are near the visible spectrum and range in wavelength from 1.5 micrometers to 11 micrometers. The preferable spectrum is 3 micrometers to 5 micrometers. These wavelengths are sufficiently small to challenge today's microchip etching techniques that would allow enough pixel strips to be placed within one wavelength distance nevertheless with some of the latest equipment such etching is achievable.

Another architecture usable for infrared plasma devices is grating-less, simply a single plasma density grating in an enclosure. This architecture uses the natural grating slope created near the boundary of the enclosure with the plasma. The enclosure also needs to be sufficiently thin so as to have a ±60 degree steering angle without exiting the side of the enclosure. The planar size limits need to be small to allow for sufficient breakdown of the ionizing gas while keeping reasonable voltage levels. Therefore, it is possible for the plasma enclosure be 10 millimeters×10 millimeters square by 5 millimeters thick. Again, for simplicity, a gas pressure of 300 torr may be used.

Figure 11:
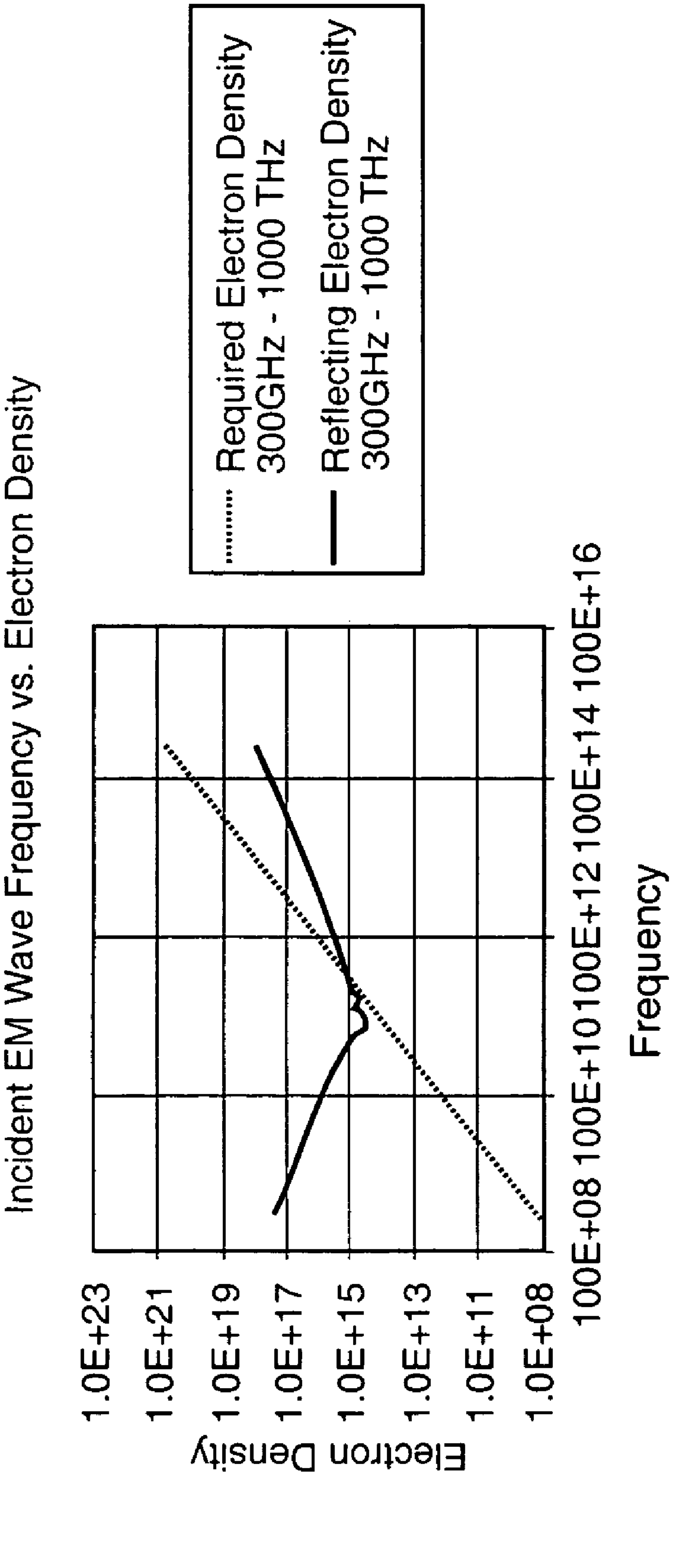
FIG. 11 shows a relationship between incident electromagnetic wave frequency and electron density relevant to plasma electromagnetic energy steering.

To set a simple limit of maximum plasma frequency on this infrared system, we consider that we will need a minimum of 2p phase delay, or m=1. A larger phase delay, m, will result in more bandwidth but also requires a larger plasma frequency and a resulting electron density. The FIG. 11 graph shows a logarithmic versus logarithmic relationship between input wave frequency and needed electron density over a wide band of radio frequency and infrared wavelengths and indicates the presence of a knee in the reflecting electron density curve where electron density, no or $n_e$, starts increasing at wavelengths above about 76 GHz; this is also indicated in the matrix shown in TABLE 5 below.

TABLE 5

(m = 1)

| λ (m) | $k_0$ | $k_p$ | $\omega_p\left(\frac{rad}{s}\right)$ | $n_0\left(\frac{\#\ electrons}{cm^3}\right)$ |
|---|---|---|---|---|
| 1.5 μm | 4.191580 * $10^6$ | 4.190330 * $10^6$ | 3.07686 * $10^{13}$ | 2.975100 * $10^{17}$ |
| 3 μm | 2.095790 * $10^6$ | 2.094540 * $10^6$ | 2.17551 * $10^{13}$ | 1.487330 * $10^{17}$ |
| 5 μm | 1.257480 * $10^6$ | 1.256220 * $10^6$ | 1.68498 * $10^{13}$ | 0.892223 * $10^{17}$ |
| 11 μm | 0.565864 * $10^6$ | 0.564607 * $10^6$ | 1.12998 * $10^{13}$ | 0.401264 * $10^{17}$ |

Figure 12:
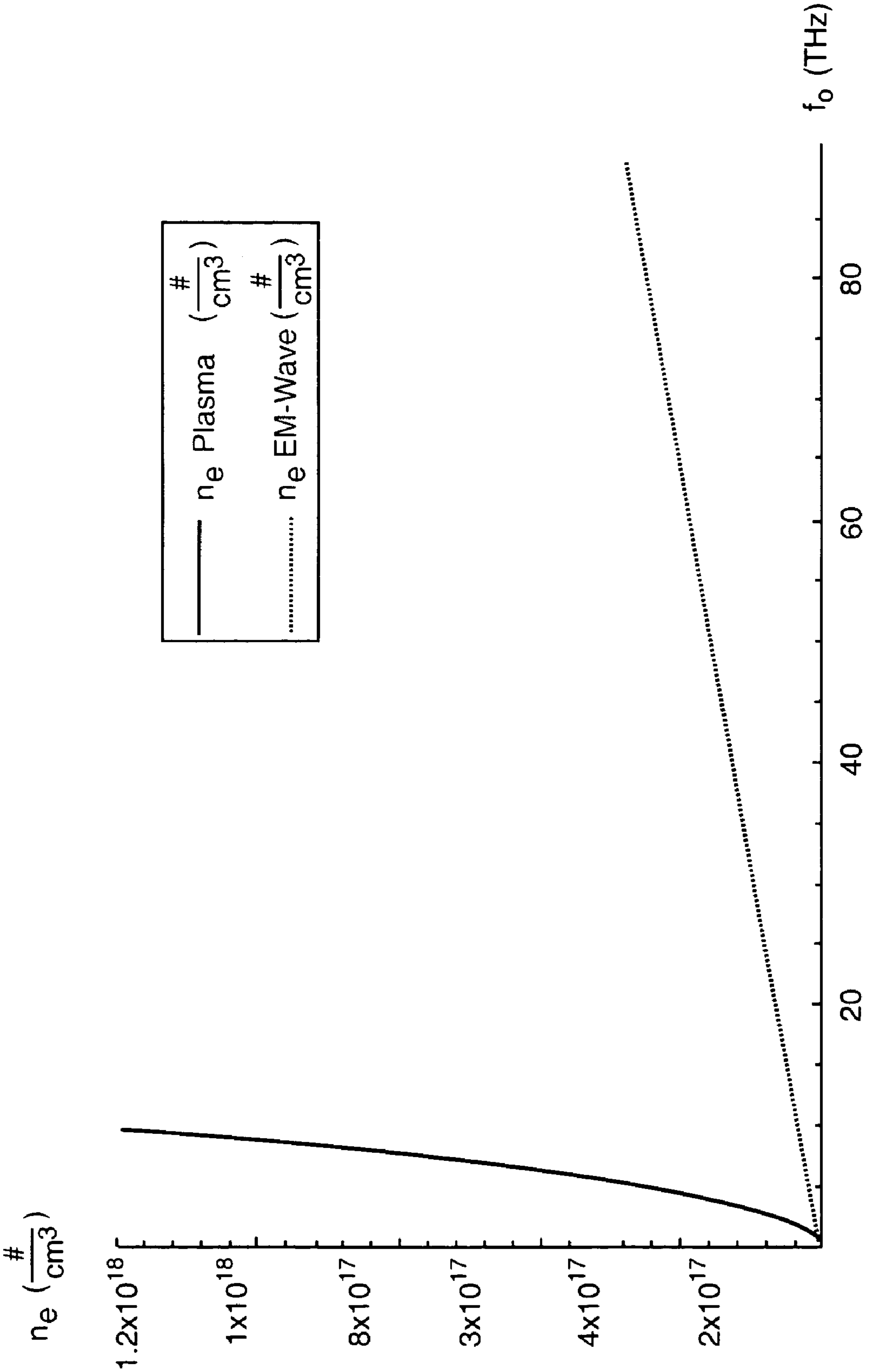
FIG. 12 shows the electron density needed to achieve a specific amount of energy wave phase shift during travel through a thickness of plasma and for a wide band of energy frequencies.

FIGS. 12 through 15 in the drawings relate plasma electron density, $n_e$, and steered energy wavelength or frequency in several energy steering situations. In FIG. 12 the electron density needed (i.e., the plasma needed) to achieve $^5$ radians or one hundred eighty degrees of input energy wave phase shift during travel through one millimeter of plasma is shown over a large range of input electromagnetic energy frequencies i.e., radio frequency and radiant energy wave spectral frequencies; this relationship appears in the lowermost of the FIG. 12 curves. The uppermost or nearly vertical curve in FIG. 12 originates in the well known equation 4.11, shown below herein, by solving the equation for the term $n_e$ and applying present environment values. Physically this uppermost of the FIG. 12 curves separates a region of great energy attenuation or absorption in plasma (depending on plasma gradient), on the left of this curve; from a region of less attenuation in which energy phase shift can be accomplished, on the right of this curve; in other words the required plasma density is less than the frequency density of the incoming wave.

$$f_p=[(e^-)^2 n_0/m_e E_0]^{1/2}/2^5 \quad \text{(EQ 4.11)}$$

Figure 13:
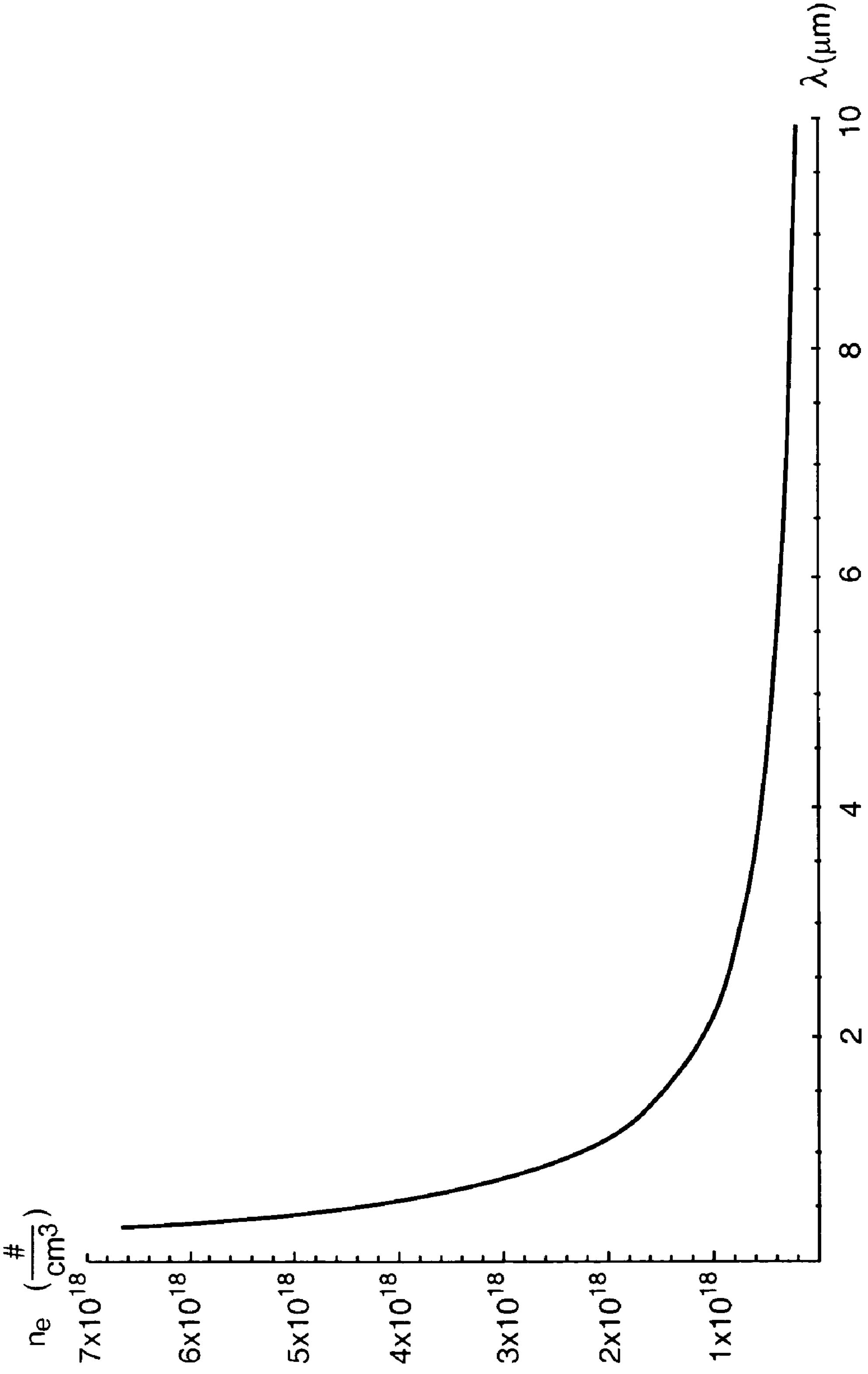
FIG. 13 shows electron density needed to achieve a greater degree of infrared energy wave phase shift during passage through a specific length of plasma.

In equation 4.11, representing the collision free case:

$f_p$ represents plasma frequency e− represents electron charge $n_0$ represents electron density $m_e$ represents electron mass $E_0$ represents the permittivity of free space FIG. 13 in the drawings illustrates the relatively high plasma electron densities needed to achieve $2^5$, or twice the $^5$ radians, of phase shift in an exposure distance of one millimeter for an infrared range of input energy wavelengths, again in the plasma exposure distance of one millimeter. Increasing the length of the plasma exposures indicated in FIG. 13 by factors of 10 or 100 for example has the effect of decreasing the plasma density dictated in FIG. 13 by factors of 10 or 100 and thus provides more easily achieved plasma density values. Use of lesser energy phase shift angles of course also enables use of lower plasma densities.

Figure 14:
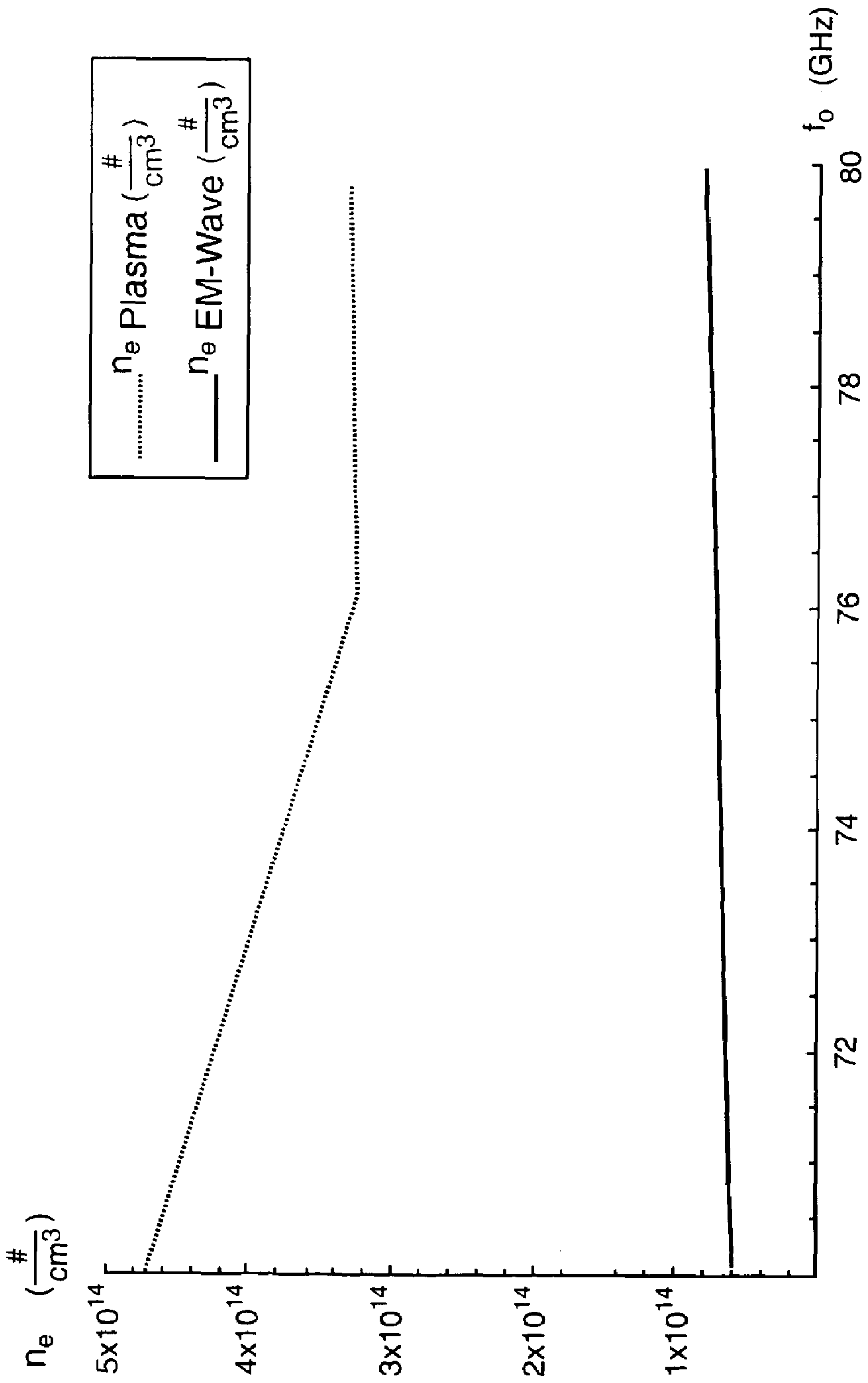
FIG. 14 shows a needed electron density and wavelength relationship including curve knee frequency shift.

FIG. 14 in the drawings shows the considerably lower plasma electron density needed for a radio frequency electromagnetic wave and shows a distinct knee incurred when seeking a greater phase shift in the same distance at higher electromagnetic wave frequencies.

Figure 6:
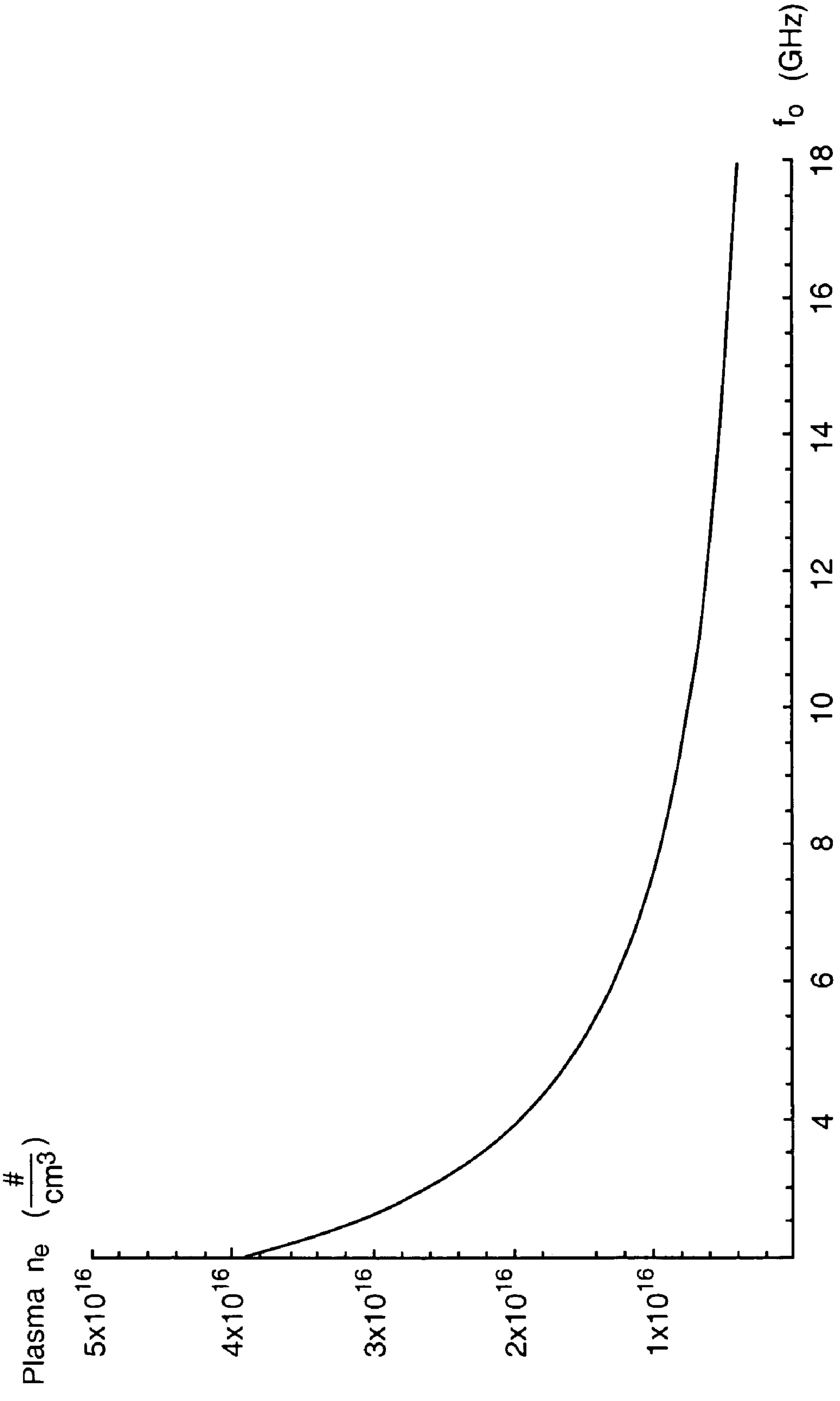
FIG. 6 shows the electron density needed to achieve a certain degree of radio frequency energy wave phase shift during passage through a specific length of plasma.
Figure 15:
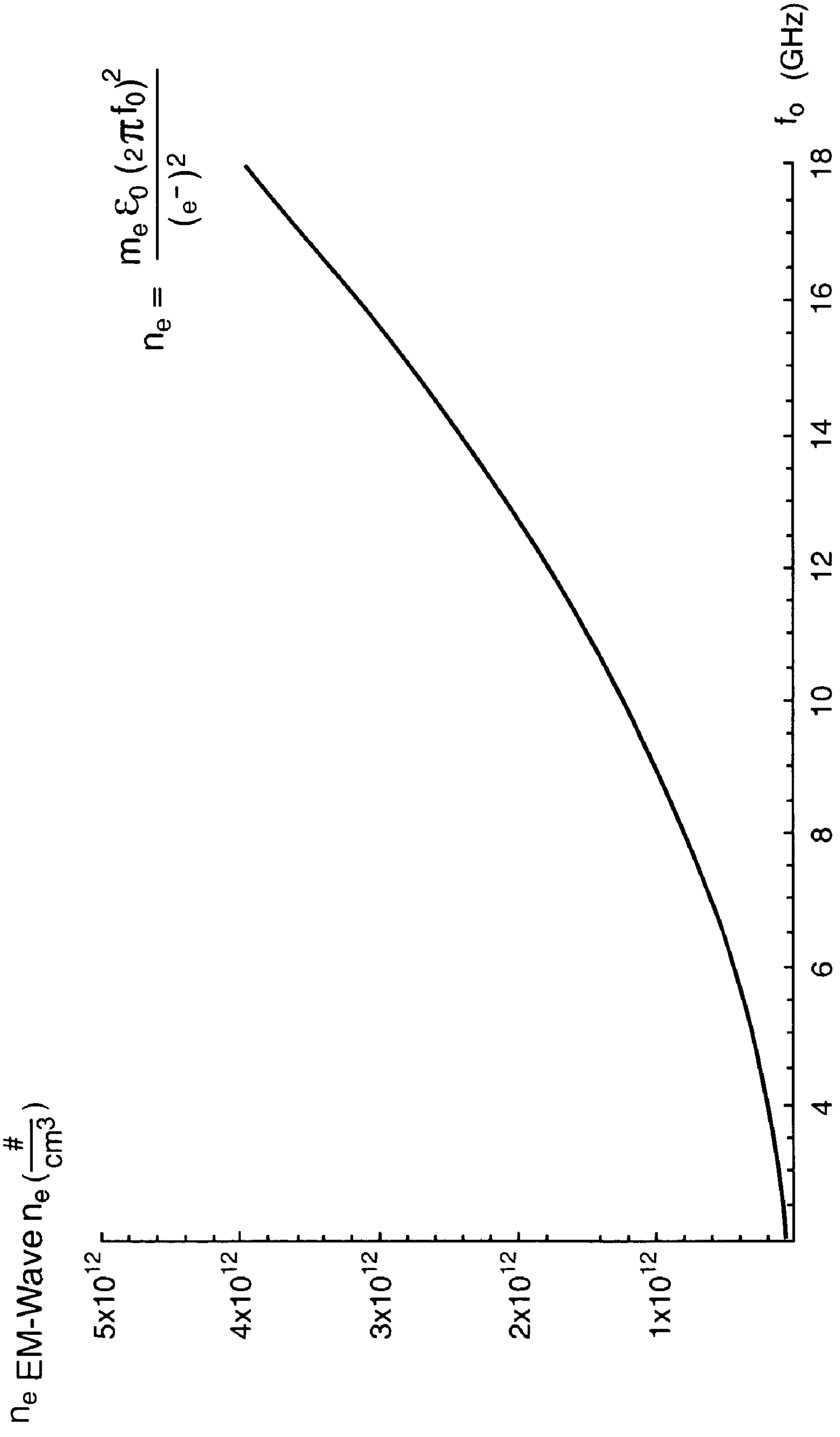
FIG. 15 shows the electron density needed to achieve a certain degree of radio frequency energy wave phase shift during passage through a specific length of plasma.

FIG. 15 shows the relationship between incident wave electron density and radio frequency in the gigahertz range if an incident electromagnetic wave were converted to a comparable electron density. FIG. 6 shows plasma electrical density needed to achieve $^5$ radians or one hundred eighty degrees of radio frequency input energy wave phase shift in a plasma length of one millimeter.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A plasma based dynamic method of pass through steering radiant electromagnetic energy, said method comprising the steps of:

disposing an array of selectively sized ionizable plasma gas concentration enhancing shapes in registration with electrode pairs of an array of electrode pairs received in a surface of an energy steering architecture; and modulating electron density in ionized portions of said ionizable plasma gas of said plasma gas concentration enhancing shapes via electrical signals applied to selected of said energy steering architecture registered electrode pairs;

said modulating including dynamically changing voltages and waveforms applied to said selected electrode pairs and alteration of incident electromagnetic energy plasma pass through by ionized plasma electron density changes achieved through modulation energizing of said electrode pairs in said array of electrode pairs.

2. The plasma based dynamic method of pass through steering radiant electromagnetic energy of claim 1 further including the steps of selecting said electromagnetic energy from an energy band of radio frequency wavelength and choosing said selectively sized ionizable plasma gas concentration enhancing shapes to include enclosed ionizable plasma gas filled modules physically disposed in radio frequency wavelength dimensions.

3. The plasma based dynamic method of pass through steering radiant electromagnetic energy of claim 1 further including the step of choosing said electrical signals applied to selected of said energy steering architecture registered electrode pairs to include an ordered sequence of incrementally differing electrode signals along a selected orientation of electrode pairs within said array of electrode pairs.

4. The plasma based dynamic method of pass through steering radiant electromagnetic energy of claim 1 further including the steps of selecting said electromagnetic energy from an energy band of optical energy wavelength and choosing said selectively sized ionizable plasma gas concentration enhancing shapes to include ionizable gas containing surface recessions physically disposed in optical energy wavelength dimensions.

5. The plasma based dynamic method of reflectively steering radiant electromagnetic energy of claim 4 further including the steps of selecting said optical energy wavelength from an infrared wavelength range.

6. A dynamic method of guiding incident radio frequency energy electromagnetic waves in a plasma based energy directing system, said method comprising the steps of:

generating an incident radio frequency energy-refracting ionized gas plasma film over a surface within said plasma based energy directing system;

sending a beam of said radio frequency energy electromagnetic waves into said gas plasma film of said plasma based energy directing system; and modulating electron density in said radio frequency energy-directing ionized gas plasma film via an array of plasma electron density controlling electrodes disposed adjacent said surface within said plasma based energy directing system;

said modulating including dynamically changing voltage patterns applied to said array of plasma electron controlling electrodes and generating direction altered radio frequency output beams from response of said incident radio frequency energy to electron density in beam encountered portions of said plasma film; and said dynamically changing modulation voltages and waveforms imparting a phase modulation directivity on refracted, passed-through incident radio frequency energy from electromagnetic response of said incident radio frequency energy to controlled plasma density and electron density in said plasma film.

7. The dynamic method of guiding incident radio frequency energy electromagnetic waves in a plasma film based energy directing architecture of claim 6 wherein said guiding of incident radio frequency energy electromagnetic waves includes refracting said output beam of radio frequency energy electromagnetic waves during a single pass through said plasma film.

8. The dynamic method of guiding incident radio frequency energy electromagnetic waves in a plasma film based energy directing architecture of claim 7 wherein said step of generating an incident radio frequency energy-refracting gas plasma film over a surface within said plasma based energy directing apparatus includes ionizing a plurality of segregated plasma film segments each responsive to a pair of electron density controlling electrodes disposed proximate said surface of said plasma based energy steering system.

9. The dynamic method of guiding incident radio frequency energy electromagnetic waves in a plasma film based energy directing architecture of claim 8 wherein said step of ionizing a plurality of segregated plasma film segments includes ionizing of plasma film portions contained within adjacent closed capsule containers.

10. The dynamic method of guiding incident radio frequency energy electromagnetic waves in a plasma film based energy directing architecture of claim 9 wherein said steps of refracting, reflecting and refracting are accomplished within each of a plurality of said plasma film segments.

11. The dynamic method of guiding incident radio frequency energy electromagnetic waves in a plasma film based energy directing architecture of claim 8 wherein said step of modulating electron density in said radio frequency energy-directing ionized gas plasma film via an array of plasma electron density controlling electrodes includes performing said modulating via electrodes having transparency characteristics with respect to said incident radio frequency energy.

12. A dynamic method of guiding incident infrared energy electromagnetic waves in a plasma based energy directing system, said method comprising the steps of:

generating an incident infrared wavelength energy-refracting ionized gas plasma film over a surface within said plasma based energy directing system;

sending a beam of said infrared wavelength energy electromagnetic waves into said gas plasma film of said plasma based energy directing system; and modulating electron density in said infrared wavelength energy-directing ionized gas plasma film via an array of plasma electron density controlling electrodes disposed adjacent said surface within said plasma based energy directing system;

said modulating including dynamically changing voltage patterns applied to said array of plasma electron density controlling electrodes and generating direction altered infrared wavelength output beams from response of said incident infrared wavelength energy to electron density in incident beam encountered portions of said plasma film; and said dynamically changing modulation voltages and waveforms imparting a phase modulation directivity on refracted, passed-through incident infrared wavelength energy from electromagnetic response of said incident infrared wavelength energy to controlled plasma density and electron density in said plasma film.

13. The dynamic method of guiding incident infrared energy electromagnetic waves in a plasma based energy directing system of claim 12 wherein said step of generating an incident infrared wavelength energy-refracting ionized gas plasma film over a surface within said plasma based energy directing system includes disposing said plasma gas in a series of indentations received in infrared wavelength dimensions within said surface.

14. The dynamic method of guiding incident infrared energy electromagnetic waves in a plasma based energy directing system of claim 12 wherein said step of generating an incident infrared wavelength energy-refracting ionized gas plasma film over a surface within said plasma based energy directing system includes disposing said gas in non-ionized form and ionizing said gas with said array of plasma electron density controlling electrodes.

15. The dynamic method of guiding incident infrared energy electromagnetic waves in a plasma based energy directing system of claim 12 wherein said generating of direction altered infrared wavelength output beams comprises an inertia free steering of said infrared wavelength energy in a scanning pattern.

* * * * *